(12) United States Patent
Satou

(10) Patent No.: US 8,040,940 B2
(45) Date of Patent: Oct. 18, 2011

(54) TRANSMITTER/RECEIVER DEVICE THAT CONVERTS SERIAL AND PARALLEL SIGNALS AND METHOD OF TESTING THEREOF

(75) Inventor: Tsutomu Satou, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1056 days.

(21) Appl. No.: 11/902,840

(22) Filed: Sep. 26, 2007

(65) Prior Publication Data

US 2008/0240212 A1 Oct. 2, 2008

(30) Foreign Application Priority Data

Sep. 29, 2006 (JP) ................................. 2006-268208
Aug. 10, 2007 (JP) ................................. 2007-209467

(51) Int. Cl.
*H04B 1/38* (2006.01)
*H04L 5/16* (2006.01)
(52) U.S. Cl. ........................ 375/221; 714/704
(58) Field of Classification Search .................. 375/219, 375/221; 714/704
See application file for complete search history.

(56) References Cited

U.S. PATENT DOCUMENTS

2008/0025383 A1* 1/2008 Li ................................. 375/226

FOREIGN PATENT DOCUMENTS

| EP | 1605619 A1 * | 12/2005 |
| JP | 2004340940 A * | 12/2004 |
| JP | A-2004-340940 | 12/2004 |

OTHER PUBLICATIONS

Kotaro Goto et al., "*Ultra-High-Speed CMOS Interface Technology*," Journal FUJITSU.55, 6, pp. 548-552.

* cited by examiner

*Primary Examiner* — Dac Ha
*Assistant Examiner* — Brian J Stevens
(74) *Attorney, Agent, or Firm* — Arent Fox LLP

(57) ABSTRACT

A transmitter/receiver device includes: a transmitter unit including a parallel/serial converting circuit, a waveform deteriorating circuit, and a transmitter circuit; and a receiver unit including a receiver circuit, a serial/parallel converting circuit, and an error detecting circuit. The parallel/serial converting circuit converts a transmitter-side parallel signal to a transmitter-side serial signal. The waveform deteriorating circuit deteriorates a signal waveform of the transmitter-side serial signal. The transmitter circuit transmits to the receiver unit the signal whose waveform is deteriorated. The receiver circuit receives, as a receiver-side serial signal, the signal transmitted from the transmitter circuit. The serial/parallel converting circuit converts the receiver-side serial signal to a receiver-side parallel signal. The error detecting circuit detects a bit error rate of the receiver-side parallel signal.

20 Claims, 33 Drawing Sheets

TRANSMITTER/RECEIVER DEVICE THAT CONVERTS SERIAL AND PARALLEL SIGNALS AND METHOD OF TESTING THEREOF

CROSS-REFERENCE TO RELATED APPLICATION

This application is based upon and claims the benefit of priority from Japanese Patent Application Nos. 2006-268208, filed on Sep. 29, 2006 and 2007-209467, filed on Aug. 10, 2007, the entire contents of which are incorporated herein by reference.

BACKGROUND

1. Field

The embodiments discussed herein are directed to a transmitter/receiver device, such as a SERDES (serializer/deserializer), including a transmitter unit which converts a parallel signal to a serial signal to transmit the serial signal and a receiver unit which receives a serial signal to convert the serial signal to a parallel signal, and it relates to a method of testing the same.

2. Description of the Related Art

In recent years, in a telecommunications technology, serialization of transmission signals and an increase in speed thereof have been progressing in accordance with an increase in telecommunication capacity. A backbone communication device with back plane (BP) transmission of 3.125 Gbps per signal line, such as 10-gigabit Ethernet (IEEE802.3ae), has been realized. Further, ultra-high-speed transmission of 6.5 Gbps and 10 Gbps per signal line is under development as next-generation technology.

FIG. 1 shows an overview of the back plane transmission. In a line card 10A (10B), a low-speed parallel signal is converted to a high-speed serial signal by a serializer 30A (30B) of a SERDES 20A (20B). Then, the high-speed serial signal is supplied to the line card 10B (10A) via the connector 40B (40A) after transmitted in a back plane 50 via a connector 40A (40B). Thereafter, in the line card 10B (10A), the high-speed serial signal supplied via the connector 40B (40A) is converted to a low-speed parallel signal by a deserializer 40B (40A) of the SERDES 20B (20A).

In a case where a high-frequency signal such as this high-speed serial signal is transmitted through a transmission medium such as a cable or a back plane, amplitude attenuation of the signal becomes larger and a change amount of its phase also increases in proportion to the frequency and transmission distance. The amplitude attenuation of the signal narrows an opening width in a vertical direction of an eye at a receiving end, and the change of the phase causes ISI (Inter Symbol Interference) to occur. If the inter symbol interference occurs, timing jitter occurs to narrow an opening width in a horizontal direction of an eye at the receiving end. As a result, the eye opening width of a signal waveform at the receiving end is narrowed as shown in FIG. 1, which makes it difficult to receive the signal. In this manner, in the transmission of the high-speed serial signal, the transmission distance is limited to a larger extent as the frequency becomes higher. Therefore, in order to realize quality improvement of a communication apparatus, it is very important, in designing the communication apparatus, to select/employ a SERDES with the knowledge of a transmittable distance of a signal.

The SERDES has a pre-emphasis function as one of its internal functions. The pre-emphasis function is to find a frequency characteristic (loss characteristic) of a transmission medium in advance and emphasize a high-frequency component of a transmission signal in order to compensate the characteristic, thereby widening an eye opening width at a receiving end. FIG. 2 shows a configuration example of a pre-emphasis circuit (4-tap pre-emphasis circuit). FIG. 3 shows an operation example of the pre-emphasis circuit in FIG. 2. In a pre-emphasis circuit 100, the following operations are executed by a delay circuit 102 and an output circuit 103 under the control of a control circuit 101. In the delay circuit 102, a serial signal IN is divided into four signals S1~S4 which are shifted from one another by 1 UI (Unit Interval) (FIG. 3(a)). Thereafter, in the output circuit 103, the signals S1~S4 are added, with output amplitudes thereof being adjusted by a DAC (Digital to Analog Converter), a differential amplifier, or the like. Consequently, at change points from "0" to "1" and change points from "1" to "0" in a serial signal OUT, a high-frequency component is emphasized (FIG. 3(b)). A 5-tap pre-emphasis circuit is disclosed in "Ultra-High-Speed CMOS Interface Technology", Journal FUJITSU, November, 2004, written by Kotaro Goto et al.

Another internal function of the SERDES is an equalizing function. The equalizing function is to find a frequency characteristic of a transmission medium in advance and emphasize a high-frequency component of a transmission signal in order to compensate the characteristic, thereby widening an eye opening width at a receiver side. FIG. 4 shows a configuration example of an equalizing circuit. FIG. 5 shows an example of frequency characteristics in an essential part of the equalizing circuit in FIG. 4. An equalizing circuit 200 includes a main circuit 201 and a control circuit 202. The main circuit 201 includes: a path P11 for transmitting a low-frequency component (DC component) of a serial signal INP; a path P12 for amplifying a high-frequency component of the serial signal INP; a path P21 for transmitting a low-frequency component of a serial signal INN; and a path P22 for amplifying a high-frequency component of the serial signal INN. Each of the paths P11, P12, P21, P22 is constituted by a filter, an amplifier, and so on. According to the frequency characteristics as expressed by the characteristic curves CVa, CVb shown in FIG. 5, the control circuit 202 controls characteristics of the filters and gains of the amplifiers in the paths P12, P22 of the main circuit 201.

A capacitor element C1 is connected between a signal line of the serial signal INP and the path P12, and a resistor element R1 is connected between a connection node of the capacitor element C1 and the path P12 and a voltage line of a voltage VTT. Similarly, a capacitor element C2 is connected between a signal line of the serial signal INN and the path P22, and a resistor element R2 is connected between a connection node of the capacitor element C2 and the path P22 and the voltage line of the voltage VTT. Further, signals having passed through the paths P11, P12 are synthesized and the resultant signal is supplied to a buffer B1, and signals having passed through the paths P21, P22 are synthesized and the resultant signal is supplied to a buffer B2. Then, a comparator CMP generates serial signals OUTP, OUTN from output signals of the buffers B1, B2. In the equalizing circuit 200 as configured above, the frequency characteristic of the path P12 (P22) of the main circuit 201 is controlled by the control circuit 202, and the signals having passed through the paths P11, P12 (P21, P22) are synthesized in the main circuit 201, so that the serial signal OUTP (OUTN) with a wide eye opening width is generated even when an eye opening width of the serial signal INP (INN) is narrowed due to the signal transmission.

FIG. 6 shows a back plane transmission margin test of a SERDES in a prior art. The back plane transmission margin test is conducted by using a SERDES 1 as a test target and a pseudo back plane 5. The SERDES 1 includes a transmitter unit 2, a receiver unit 3, and a control unit 4. The transmitter unit 2 includes a pattern generator 2a, a selector 2b, a PLL (Phase-Locked Loop) circuit 2c, a serializer 2d, a pre-emphasis circuit 2e, and a driver 2f.

The pattern generator 2a generates a pseudo random pattern such as a PRBS (Pseudo Random Bit Stream) signal to output it to the selector 2b in response to a command from the control unit 4. According to a command from the control unit 4, the selector 2b selects a parallel signal PDI supplied via an external pin P1 or the parallel signal supplied from the pattern generator 2a to output the selected signal to the serialize 2d. The PLL circuit 2c generates a multiplied clock based on a reference clock CKR supplied via an external pin P2, to output the multiplied clock to the serializer 2d.

The serializer 2d converts the parallel signal supplied from the selector 2b to a serial signal synchronous with the clock supplied from the PLL circuit 2c to output the serial signal to the pre-emphasis circuit 2e. According to a command from the control unit 4, the pre-emphasis circuit 2e applies a pre-emphasis process (process to emphasize a high-frequency component) to the serial signal supplied from the serializer 2d to output the resultant serial signal to the driver 2f. The driver 2f outputs differential serial signals SDOP, SDON corresponding to the serial signal supplied from the pre-emphasis circuit 2e, to an external part via external pins P3, P4.

The receiver unit 3 includes a receiver 3a, a CDR (Clock and Data Recovery) circuit 3b, a deserializer 3c, and an error detector 3d. The receiver 3a outputs to the CDR circuit 3b a serial signal corresponding to differential serial signals SDIP, SDIN supplied via external pins P6, P7. The CDR circuit 3b recovers a clock and data regarding the serial signal supplied from the receiver 3a to output the serial signal to the deserializer 3c.

The deserializer 3c converts the serial signal supplied from the CDR circuit 3b to a parallel signal to output the resultant signal as a parallel signal PDO to an external part via an external pin P8. The deserializer 3c also outputs the parallel signal PDO to the error detector 3d. In response to a command from the control unit 4, the error detector 3d detects a BER (Bit Error Rate) of the parallel signal supplied from the deserializer 3c. The control unit 4 controls the circuits of the transmitter unit 2 and the circuits of the receiver unit 3 according to a control signal CTL supplied via an external pin P5.

The back plane transmission margin test of the SERDES 1 as configured above is conducted in the following manner. First, the pattern generator 2a generates a pseudo random pattern to supply the pseudo random pattern as a low-speed parallel signal to the serializer 2d via the selector 2b. Next, the serializer 2d converts the low-speed parallel signal supplied form the selector 2b to a high-speed serial signal synchronous with a high-speed clock supplied from the PLL circuit 2c. Then, the pre-emphasis circuit 2e performs the pre-emphasis process to the serial signal supplied from the serializer 2d and thereafter outputs the resultant serial signal to an external part (pseudo back plane 5) via the driver 2f and the external pins P3, P4. The differential serial signals SDOP, SDON outputted from the external pins P3, P4 of the SERDES 1 are transmitted through the pseudo back plane 5, and are thereafter supplied as the differential serial signals SDIP, SDIN to the external pins P6, P7 of the SERDES 1.

A clock and data of the high-speed serial signal (serial signal corresponding to the differential serial signals SDIP, SDIN) supplied from the receiver 3a are recovered by the CDR circuit 3b, and thereafter, the high-speed serial signal is converted to a low-speed parallel signal by the deserializer 3c.

Then, the error detector 3d detects a bit error rate of the low-speed parallel signal supplied from the deserializer 3c. At this time, a plurality of the pseudo back planes 5 different in transmission distance (transmission loss) are used and the maximum transmission distance when the bit error rate detected by the error detector 3d is a predetermined value (for example, 10 to the power of −12) or lower is measured.

As for jitter tolerance, jitter amounts at output far ends of transmission signals (that is, jitter amounts of the transmission signals when they are inputted to SERDES) are specifically defined in the XAUI (10 Gigabit Attachment Unit Interface) standard for 10 gigabit Ethernet prescribed in, for example, IEEE802.3ae, and a device compliant with the XAUI standard is required to be capable of receiving a transmission signal on which jitter of TJ (Total Jitter)=0.65 UI or more is superimposed.

FIG. 7 shows a jitter tolerance test of a SERDES in a prior art. The jitter tolerance test is conducted by using a SERDES 1 as a test target, a BERT (Bit Error Tester) 6, a sinusoidal generator 7, and a pseudo back plane 8. The BERT 6 includes an error detector 6a, a signal generator 6b, and a pattern generator 6c.

In the jitter tolerance test, a PRBS pattern (serial signal) is outputted from the pattern generator 6c of the BERT 6. At this time, the sinusoidal generator 7 phase-modulates a sinusoidal signal of 100 kHz~80 MHz to apply sinusoidal jitter to a reference clock of the signal generator 6b of the BERT 6. Consequently, the pattern generator 6c of the BERT 6 outputs a high-speed serial signal on which the SJ (Sinusoidal Jitter) is superimposed. The serial signal with the jitter superimposed thereon is inputted to external pins P6, P7 of the SERDES 1 and the error detector 3d detects a bit error rate. At this time, the maximum jitter amount receivable by the SERDES 1 is measured while an amount of the jitter in the high-speed serial signal is varied. This characteristic is called Sinusoidal Jitter Tolerance, which is defined as a mask in the standard such as the SONET (Synchronous Optical Network) standard, the XAUI standard, and the like. Further, the XAUI standard specifically defines jitter components regarding the jitter tolerance, and conditions set therein are TJ=0.65 UI, DJ=0.37 UI, DJ+RJ=0.55 UI. Therefore, in some cases, when the jitter tolerance test is conducted, the pseudo back plane 8 is provided between the BERT 6 and the SERDES 1 to superimpose DJ (Deterministic jitter) due to inter symbol interference on the differential serial signals SDIP, SDIN inputted to the external pins P6, P7 of the SERDES 1. In this manner, to test a device compliant with the XAUI standard and the like, some mechanism capable of adjusting an amount of superimposed jitter of each jitter component is required.

As a technique aiming at an efficient jitter tolerance test, well-known is a technique to conduct a jitter tolerance test by inputting an output signal of a transmitter unit of a SERDES to a receiver unit via an external unit and delaying the output signal in the external unit to give arbitrary waveform deterioration to the output signal (see, for example, Japanese Unexamined Patent Application Publication No. 2004-340940).

In the back plane transmission margin test shown in FIG. 6, in order to reproduce waveform deterioration due to the back plane transmission of the differential serial signals SDOP, SDON outputted from the SERDES 1 (increase in jitter due to the amplitude attenuation of the signal and inter symbol interface), it is necessary to use the plural pseudo back planes 5 different in wiring length (transmission distance). However, fabricating the plural pseudo back plane 5 different in wiring length costs extremely high.

Further, in the jitter tolerance test shown in FIG. 7, in order to superimpose desired jitter on the differential serial signals SDIP, SDIN inputted to the SERDES 1, a very expensive testing apparatus such as the BERT 6 has to be used, and a testing apparatus compatible to 10 Gbps signal transmission sometimes costs several million yen, which has made it difficult in terms of cost for a user to conduct the test.

SUMMARY

It is an aspect of the embodiments discussed herein to provide a transmitter/receiver device having a transmitter unit and a receiver unit, in which the transmitter unit includes a parallel/serial converting circuit converting a transmitter-side parallel signal to a transmitter-side serial signal, a waveform deteriorating circuit deteriorating a signal waveform of the transmitter-side serial signal and a transmitter circuit transmitting to the receiver unit the signal whose waveform is deteriorated, and the receiving unit includes a receiver circuit receiving, as a receiver-side serial signal, the signal transmitted from the transmitter circuit, a serial/parallel converting circuit converting the receiver-side serial signal to a receiver-side parallel signal, and an error detecting circuit detecting a bit error rate of the receiver-side parallel signal.

DETAILED DESCRIPTION OF THE EMBODIMENTS

Figure 8:
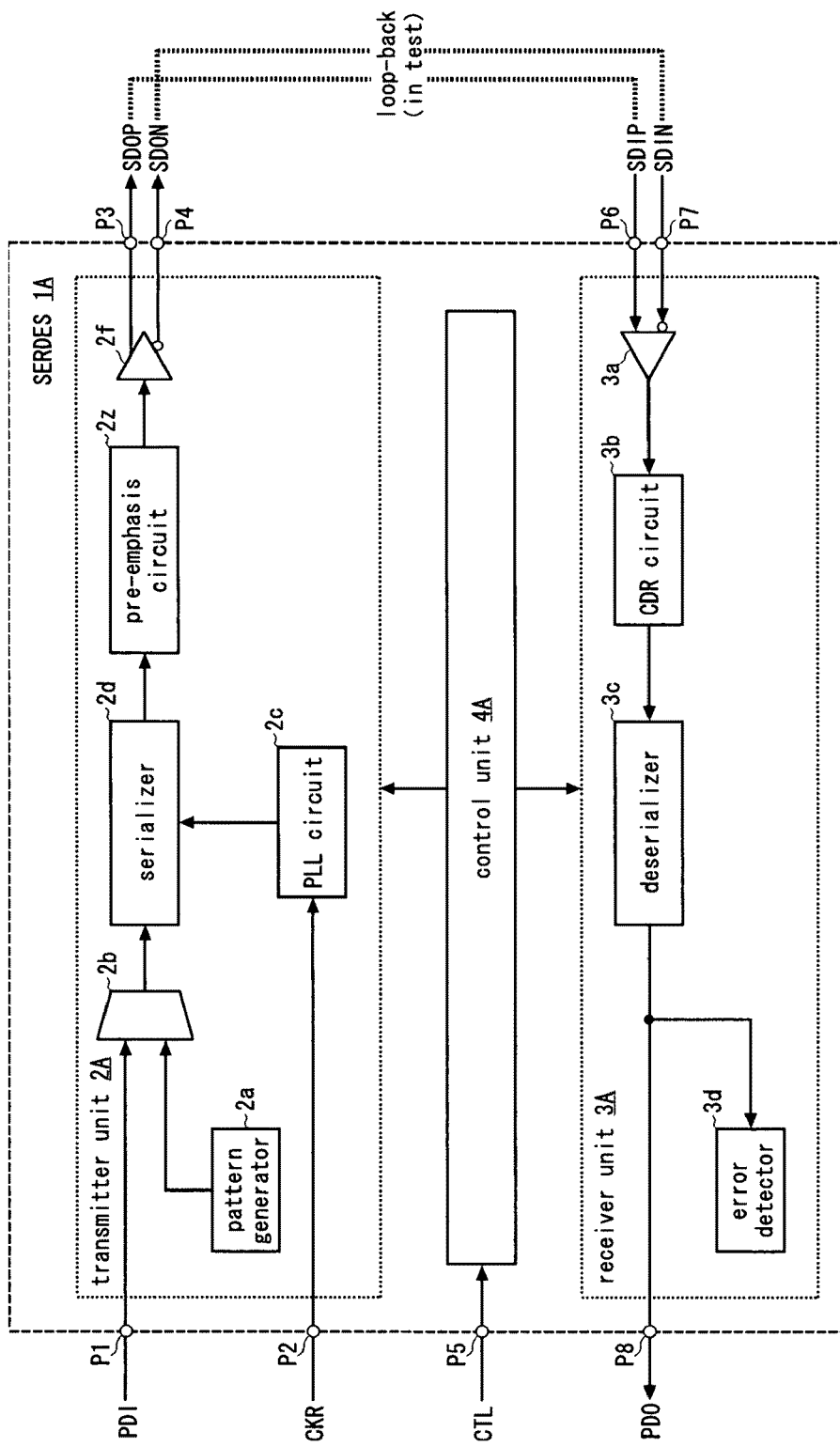
FIG. 8 is a block diagram showing a first embodiment.
Figure 9:
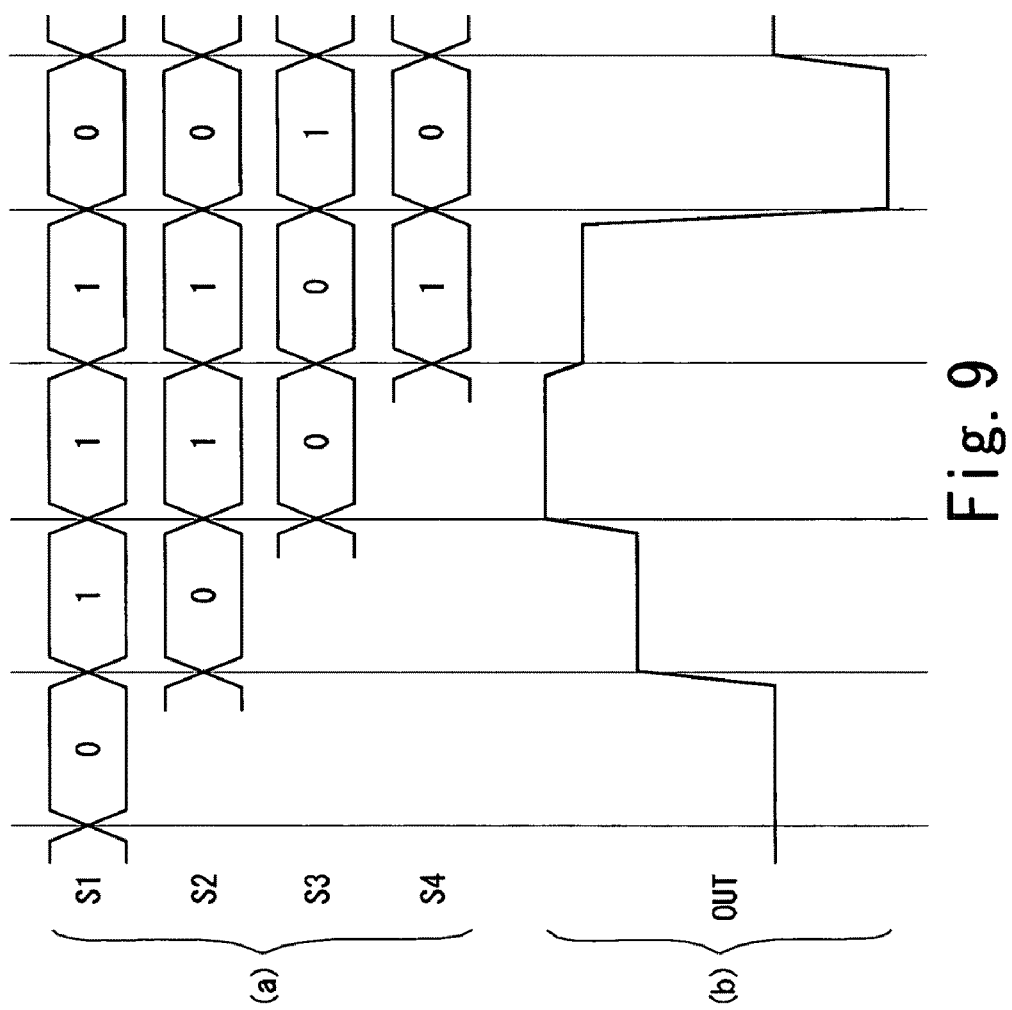
FIG. 9 is a timing chart showing an operation example of a pre-emphasis circuit in FIG. 8.

Hereinafter, embodiments will be described by using the drawings. FIG. 8 shows a first embodiment. FIG. 9 shows an operation example of a pre-emphasis circuit in FIG. 8. Hereinafter, in the following description of the first embodiment (FIG. 8), the same elements as the elements described in FIG. 6 will be denoted by the same reference numerals and symbols as those used in FIG. 6, and detailed description thereof will be omitted. A SERDES 1A includes a transmitter unit 2A, a receiver unit 3A, and a control unit 4A. The transmitter unit 2A is structured such that in the transmitter unit 2 (FIG. 6), a pre-emphasis circuit 2z is provided in place of the pre-emphasis circuit 2e.

Figure 1:
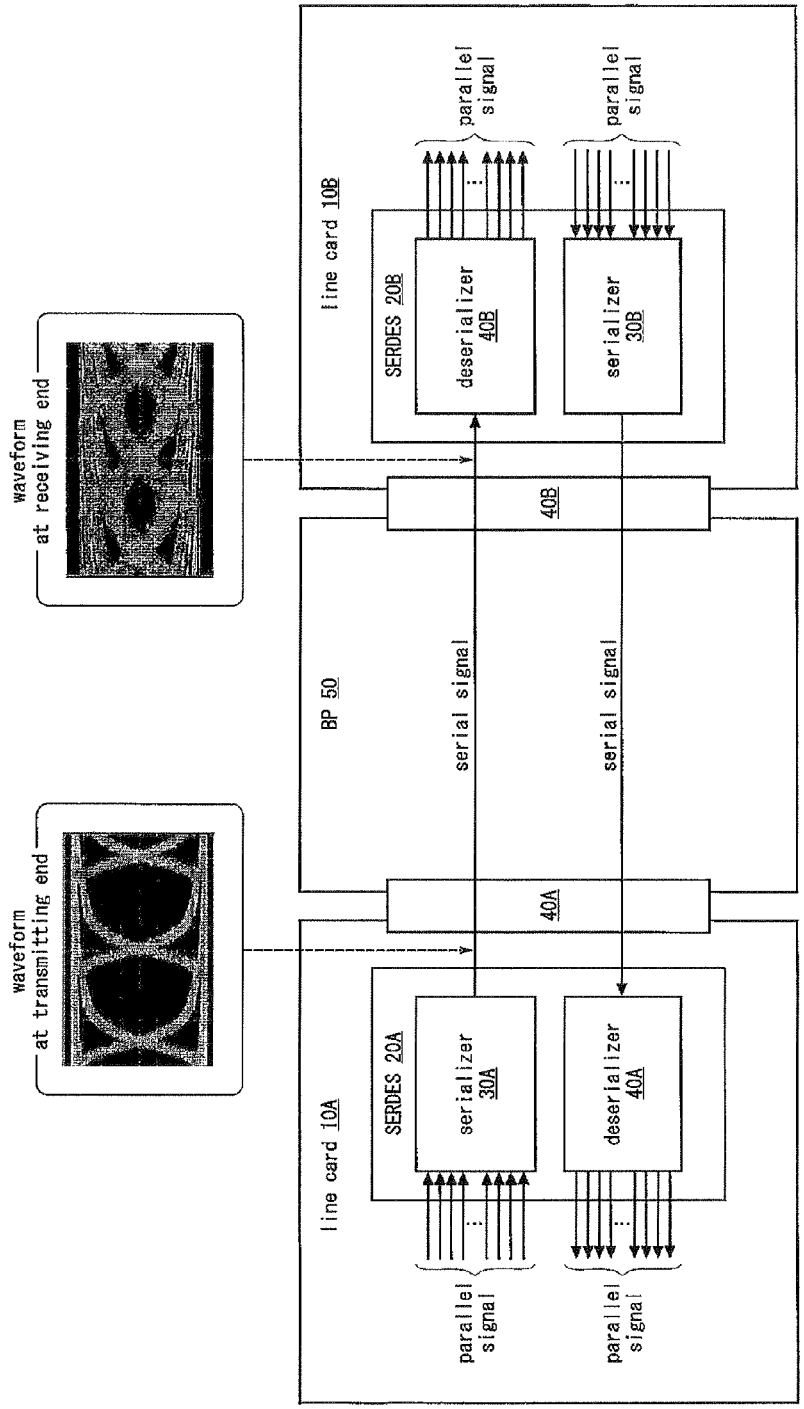
FIG. 1 is an explanatory view showing an overview of back plane transmission.
Figure 2:
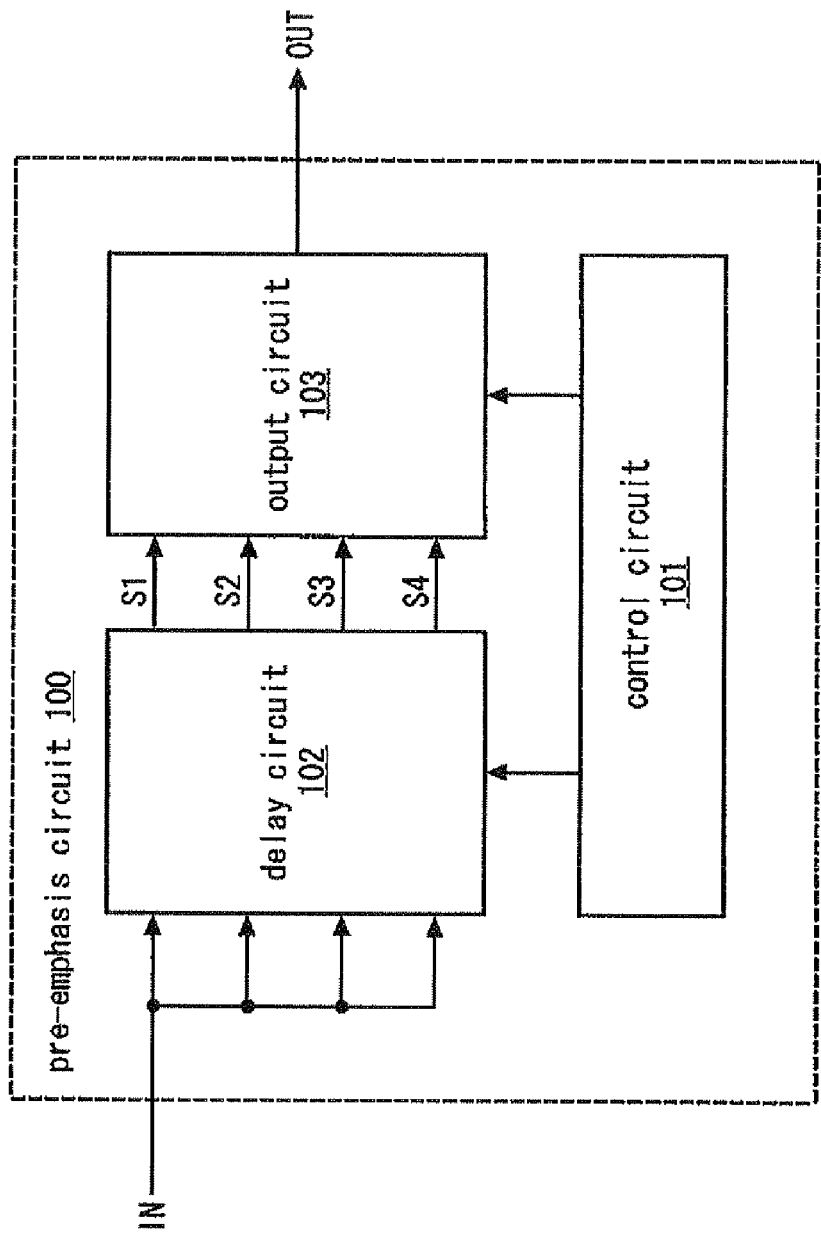
FIG. 2 is a block diagram showing a configuration example of a pre-emphasis circuit.
Figure 3:
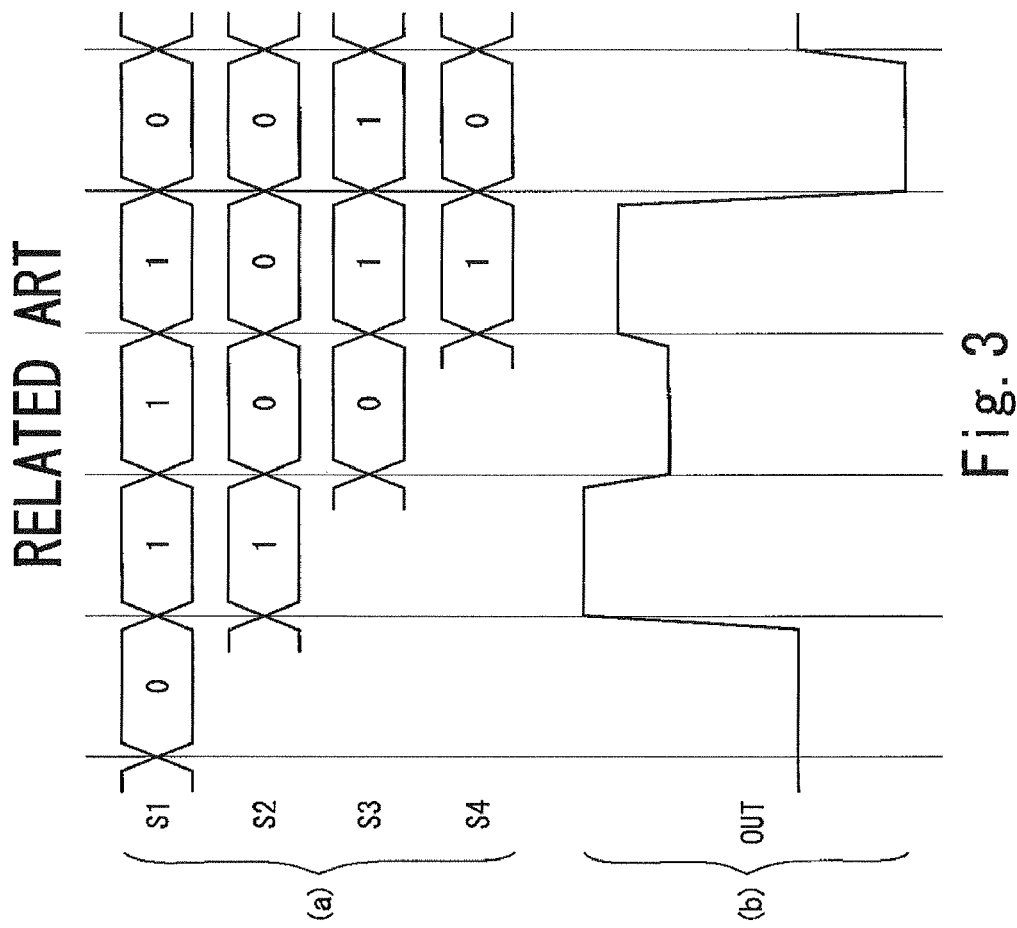
FIG. 3 is a timing chart showing an operation example of the pre-emphasis circuit in FIG. 2.

According to a command from the control unit 4A, the pre-emphasis circuit 2z applies a pre-emphasis process to a serial signal supplied from the serializer 2d, to output the resultant serial signal to the driver 2f. Further, according to a command from the control unit 4A, the pre-emphasis circuit 2z is also capable of executing a waveform deteriorating process to generate waveform deterioration (amplitude attenuation of the signal) by applying the pre-emphasis process to the serial signal supplied from the serializer 2d. For example, assuming that the pre-emphasis circuit 2z has the same circuit configuration as that of the pre-emphasis circuit 100 (FIG. 2), at the time of the waveform deteriorating process, the pre-emphasis circuit 2z divides the serial signal supplied from the serializer 2d into four signals S1~S4 that are shifted from one another as shown in FIG. 9(a), so that waveform deterioration corresponding to the command of the control unit 4A is generated at change points from "0" to "1" and change points from "1" to "0" in a serial signal OUT supplied to the driver 2f as shown in FIG. 9(b). Incidentally, the command regarding the waveform deteriorating process which is given from the control unit 4A to the pre-emphasis circuit 2z is prescribed according to, for example, transmission distance and transmission loss.

The receiver unit 3A, which is the same as the receiver unit 3 (FIG. 6), includes a receiver 3a, a CDR circuit 3b, a deserializer 3c, and an error detector 3d. The control unit 4A executes the same operation as that of the control unit 4 (FIG. 6) and in addition, also executes an operation for controlling the waveform deteriorating process of the pre-emphasis circuit 2z.

Here, a method of testing the SERDES 1A will be described. A back plane transmission margin test and a jitter tolerance test of the SERDES 1A are executed in the following manner while the external pins P3, P4 of the SERDES 1A are connected in loop-back to the external pins P6, P7. First, the pattern generator 2a generates a pseudo random pattern, and the pseudo random pattern is supplied as a low-speed parallel signal to the serializer 2d via the selector 2b. Next, the serializer 2d converts the low-speed parallel signal supplied from the selector 2b to a high-speed serial signal synchronous with a high-speed clock supplied from the PLL circuit 2c. Then, the serial signal supplied from the serializer 2d, after subjected to the waveform deteriorating process by the pre-emphasis circuit 2z, is outputted to an external part via the driver 2f and the external pins P3, P4. Differential serial signals SDOP, SDON outputted from the external pins P3, P4 of the SERDES 1A are supplied as differential serial signals SDIP, SDIN to the external pins P6, P7 of the SERDES 1A.

After a clock and data of a high-speed serial signal (serial signal corresponding to the differential serial signals SDIP, SDIN) supplied from the receiver 3a are recovered by the CDR circuit 3b, the high-speed serial signal is converted to a low-speed parallel signal by the deserializer 3c. Then, the error detector 3d detects a bit error rate of the low-speed parallel signal supplied from the deserializer 3c. At this time, in a case of the back plane transmission margin test, the waveform deteriorating process in the pre-emphasis circuit 2z is executed for each transmission distance, and the maximum transmission distance when the bit error rate detected by the error detector 3d is a predetermined value (for example, 10 to the power of −12) or less is measured. Further, in a case of the jitter tolerance test, it is also possible, for example, to measure an XAUI standard jitter tolerance margin by executing the waveform deteriorating process in the pre-emphasis circuit 2z in accordance with an eye mask (eye opening width) prescribed by the XAUI standard.

In the first embodiment as described above, when the back plane transmission margin test and the jitter tolerance test of the SERDES 1A are conducted, the pre-emphasis circuit 2z can reproduce the waveform deterioration due to the signal transmission of the differential serial signals SDOP, SDON. Therefore, it is possible to easily conduct the back plane transmission margin test and the jitter tolerance test only by feeding back the differential serial signals SDOP, SDON as the differential serial signals SDIP, SDIN without using any expensive testing apparatus such as a BERT.

Figure 10:
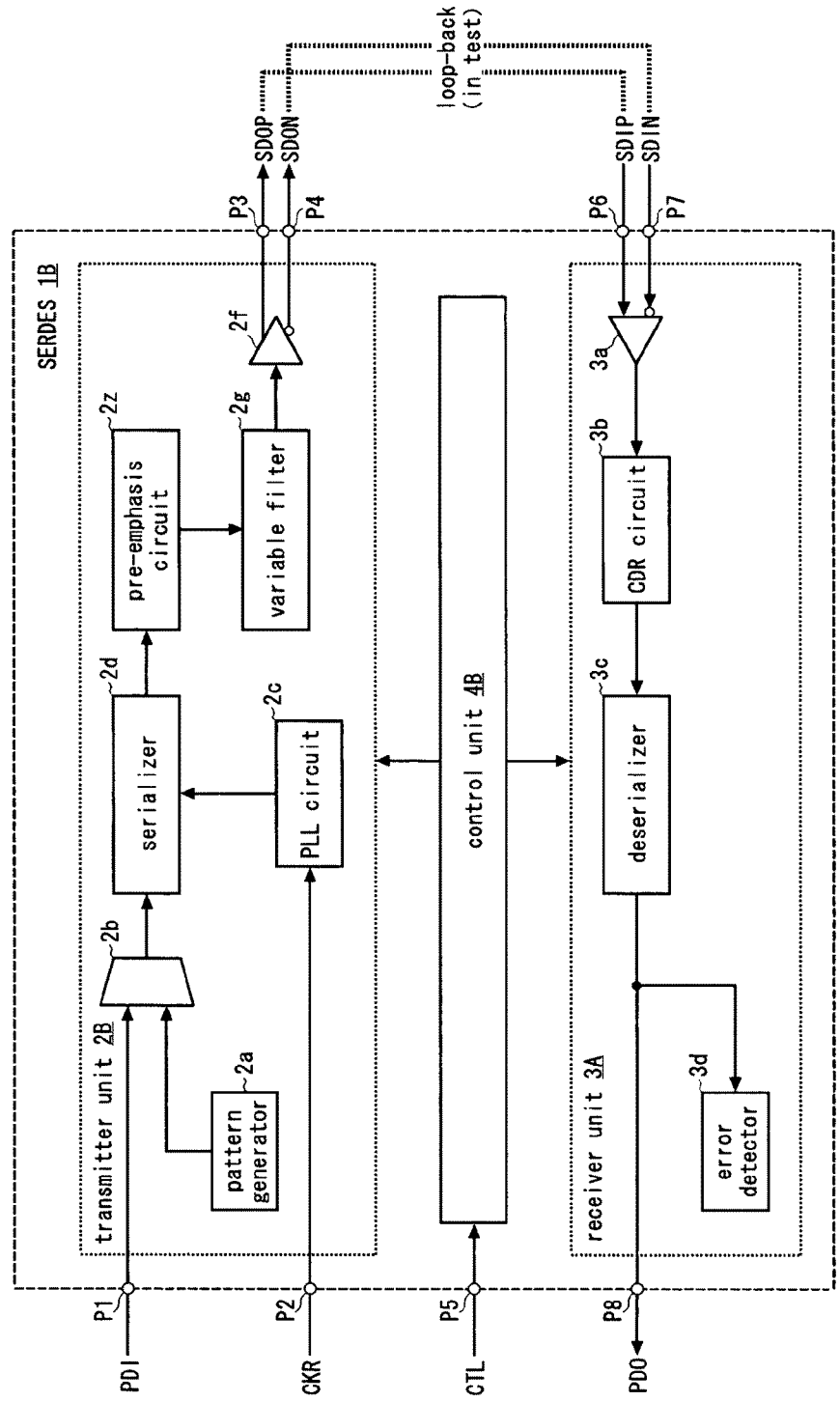
FIG. 10 is a block diagram showing a second embodiment.

FIG. 10 shows a second embodiment. Hereinafter, in the following description of the second embodiment (FIG. 10), the same elements as the elements described in the first embodiment (FIG. 8) will be denoted by the same reference numerals and symbols as those used in the first embodiment, and detailed description thereof will be omitted. A SERDES 1B includes a transmitter unit 2B, the receiver unit 3A (first embodiment), and a control unit 4B. The transmitter unit 2B is structured such that in the transmitter unit 2A (first embodiment), a variable filter 2g is additionally provided between the pre-emphasis circuit 2z and the driver 2f.

The variable filter 2g filters a serial signal supplied from the pre-emphasis circuit 2z based on a frequency characteristic (pass band) that is set according to a command from the control unit 4B, to output the serial signal to the driver 2f. The control unit 4B executes the same operation as that of the control unit 4B (first embodiment), and in addition, also executes an operation of controlling the variable filter 2g of the transmitter unit 2B.

In the second embodiment as described above, at the time of a back plane transmission margin test and a jitter tolerance test, by setting the frequency characteristic of the variable filter 2g according to a loss characteristic of a transmission medium via a control signal CTL, it is possible to more accurately reproduce waveform deterioration of differential serial signals SDOP, SDON due to signal transmission.

Figure 11:
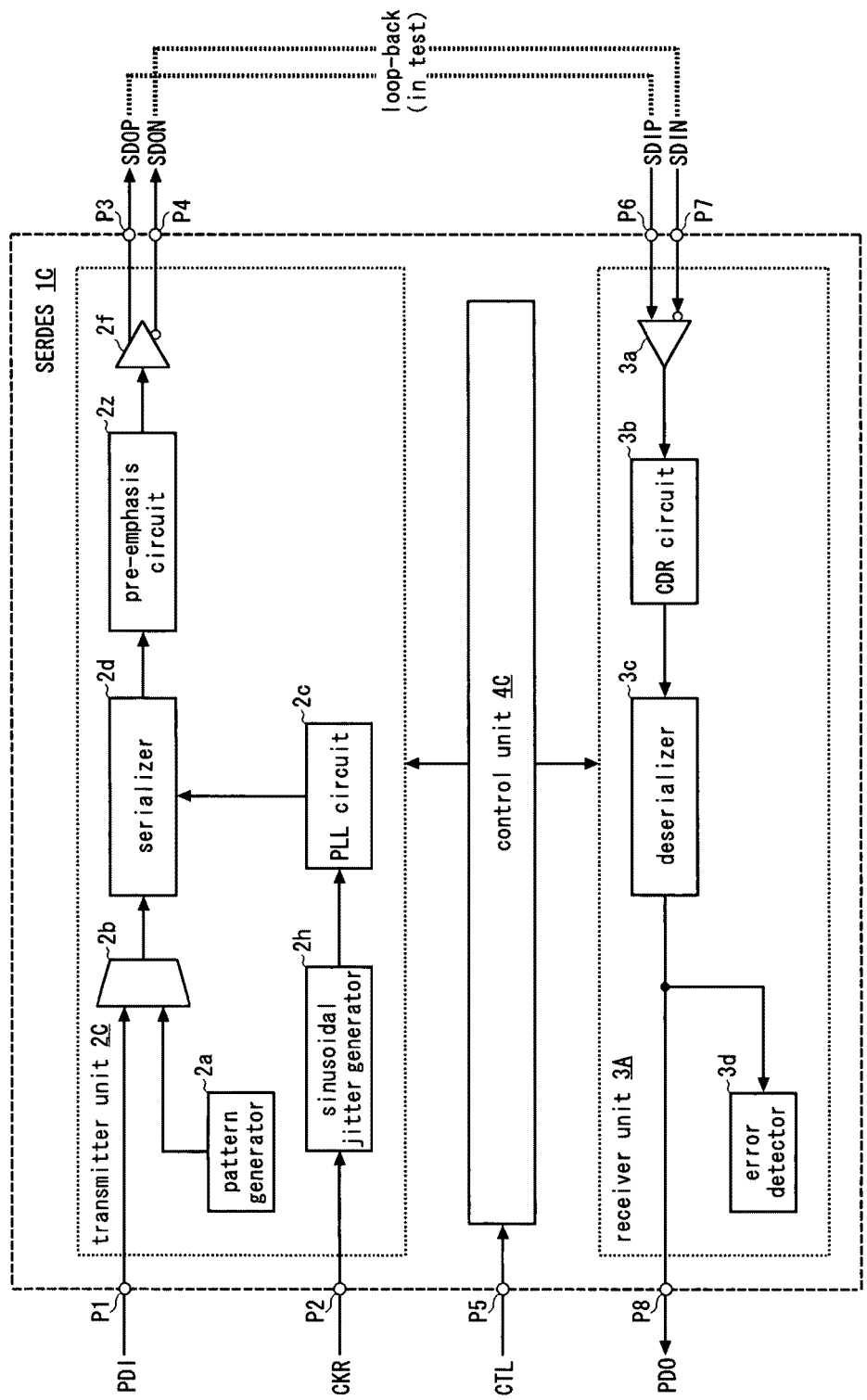
FIG. 11 is a block diagram showing a third embodiment.

FIG. 11 shows a third embodiment. Hereinafter, in the following description of the third embodiment (FIG. 11), the same elements as the elements described in the first embodiment (FIG. 8) will be denoted by the same reference numerals and symbols as those used in the first embodiment, and detailed description thereof will be omitted. A SERDES 1C includes a transmitter unit 2C, the receiver unit 3A (first embodiment), and a control unit 4C. The transmitter unit 2C is structured such that in the transmitter unit 2A (first embodiment), a sinusoidal jitter generator 2h is additionally provided between the external pin P2 and the PLL circuit 2c.

According to a command from the control unit 4C, the sinusoidal jitter generator 2h superimposes sinusoidal jitter (a kind of cyclic jitter) on a reference clock CKR supplied via the external pin P2, to output the resultant reference clock CKR to the PLL circuit 2c. Consequently, when the sinusoidal jitter generator 2h is in operation, the sinusoidal jitter in an amount corresponding to the command from the control unit 4C is superimposed on the clock supplied from the PLL circuit 2c to the serializer 2d, and as a result, the sinusoidal jitter occurs in differential serial signals SDOP, SDON. The control unit 4C executes the same operation as that of the control unit 4A (first embodiment), and in addition, also executes an operation of controlling the sinusoidal jitter generator 2h of the transmitter unit 2C.

In the third embodiment as described above, since the sinusoidal jitter generator 2h is provided between the external pin P2 and the PLL circuit 2c, it is possible to superimpose a desired cyclic jitter component on the differential serial signals SDOP, SDON by controlling the sinusoidal jitter generator 2h via a control signal CTL, at the time of a back plane transmission margin test and a jitter tolerance test, and as a result, the tests can be conducted in a more sophisticated manner.

Figure 12:
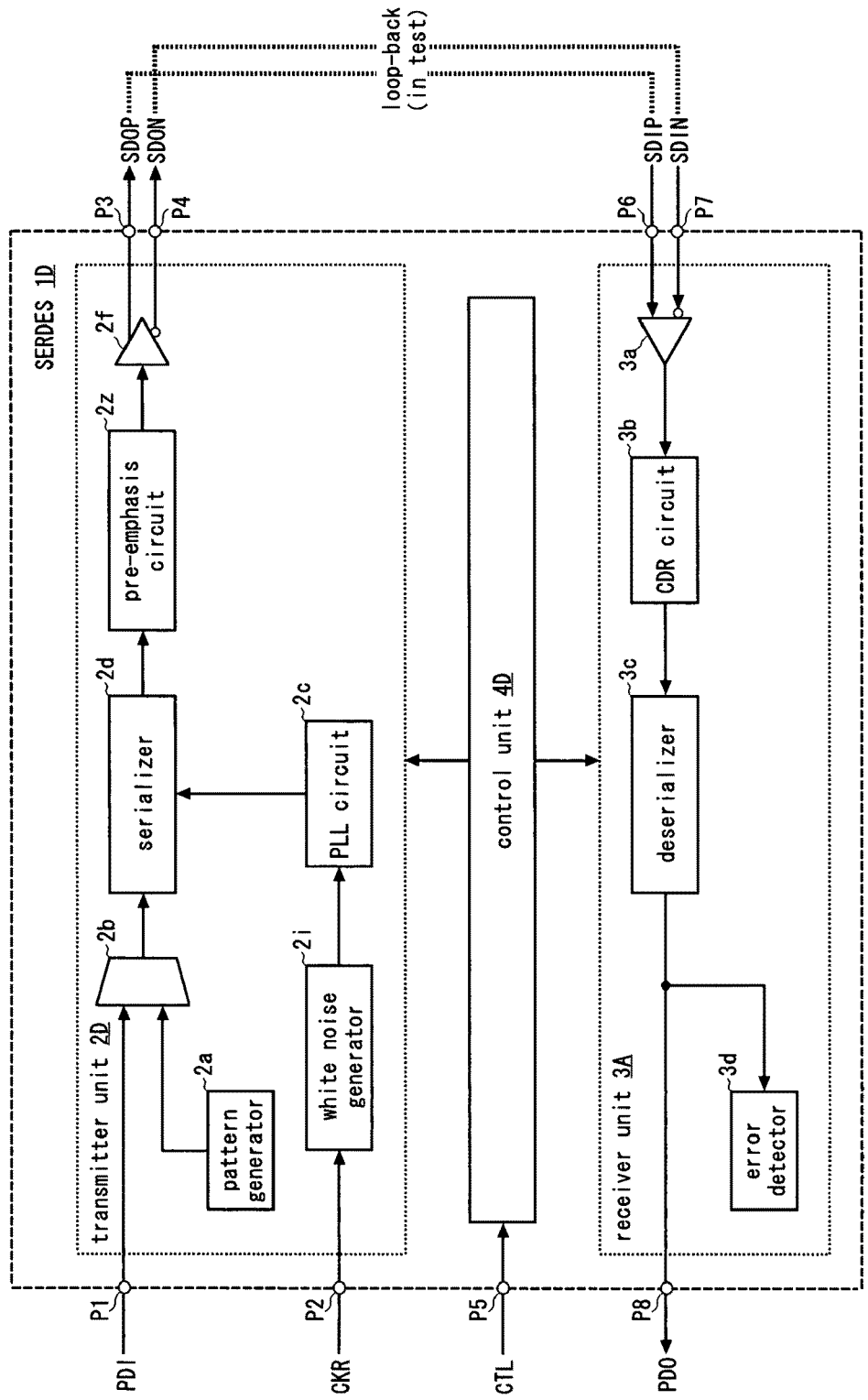
FIG. 12 is a block diagram showing a fourth embodiment.

FIG. 12 shows a fourth embodiment. Hereinafter, in the following description of the fourth embodiment (FIG. 12), the same elements as the elements described in the first embodiment (FIG. 8) will be denoted by the same reference numerals and symbols as those used in the first embodiment, and detailed description thereof will be omitted. A SERDES 1D includes a transmitter unit 2D, the receiver unit 3A (first embodiment), and a control unit 4D. The transmitter unit 2D is structured such that in the transmitter unit 2A (first embodiment), a white noise generator 2i is additionally provided between the external pin P2 and the PLL circuit 2c.

According to a command from the control unit 4D, the white noise generator 2i superimposes white noise (a kind of random jitter) on a reference clock CKR supplied via the external pin P2 and supplies the resultant reference clock CKR to the PLL circuit 2c. Consequently, when the white noise generator 2i is in operation, the white noise in a noise amount corresponding to the command of the control unit 4D is superimposed on the clock supplied from the PLL circuit 2c to the serializer 2d, and as a result, the white noise occurs in differential serial signals SDOP, SDON. The control unit 4D executes the same operation as that of the control unit 4A (first embodiment), and in addition, also executes an operation of controlling the white noise generator 2i of the transmitter unit 2D.

In the fourth embodiment as described above, since the white noise generator 2i is provided between the external pin P2 and the PLL circuit 2c, it is possible to superimpose desired random jitter component on the differential serial signals SDOP, SDON by controlling the white noise generator 2i via a control signal CTL, at the time of a back plane transmission margin test and a jitter tolerance test, and as a result, the tests can be conducted in a more sophisticated manner.

Figure 13:
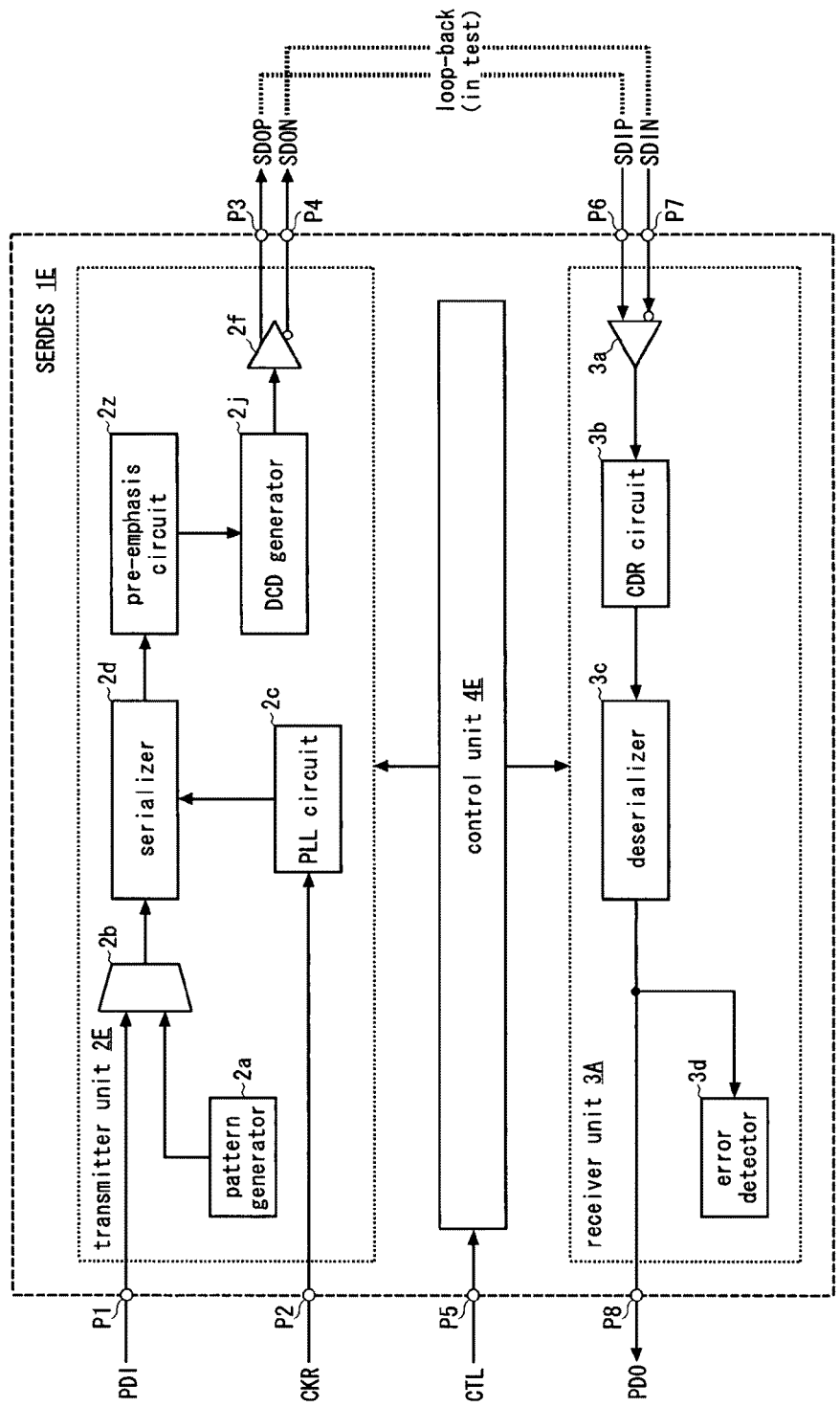
FIG. 13 is a block diagram showing a fifth embodiment.

FIG. 13 shows a fifth embodiment. Hereinafter, in the following description of the fifth embodiment (FIG. 13), the same elements as the elements described in the first embodiment (FIG. 8) will be denoted by the same reference numerals and symbols as those used in the first embodiment, and detailed description thereof will be omitted. A SERDES 1E includes a transmitter unit 2E, the receiver unit 3A (first embodiment), and a control unit 4E. The transmitter unit 2E is structured such that in the transmitter unit 2A (first embodiment), a DCD (Duty Cycle Distortion) generator 2$j$ is additionally provided between the pre-emphasis circuit 2$z$ and the driver 2$f$.

According to a command from the control unit 4E, the DCD generator 2$j$ generates duty cycle distortion in a serial signal supplied from the pre-emphasis circuit 2$e$ to supply the resultant serial signal to the driver 2$f$. Consequently, the duty cycle distortion in a distortion amount corresponding to the command from the control unit 4E is superimposed on the serial signal supplied to the driver 2$f$. As a result, the duty cycle distortion occurs in differential serial signals SDOP, SDON. The control unit 4E executes the same operation as that of the control unit 4A (first embodiment), and in addition, also executes an operation of controlling the DCD generator 2$j$ of the transmitter unit 2E.

In the fifth embodiment as described above, since the DCD generator 2$j$ is provided between the pre-emphasis circuit 2$z$ and the driver 2$f$, it is possible to superimpose a desired DCD component on the differential serial signals SDOP, SDON by controlling the DCD generator 2$j$ via a control signal CTL at the time of a back plane transmission margin test and a jitter tolerance test. As a result, the tests can be conducted in a more sophisticated manner.

Figure 14:
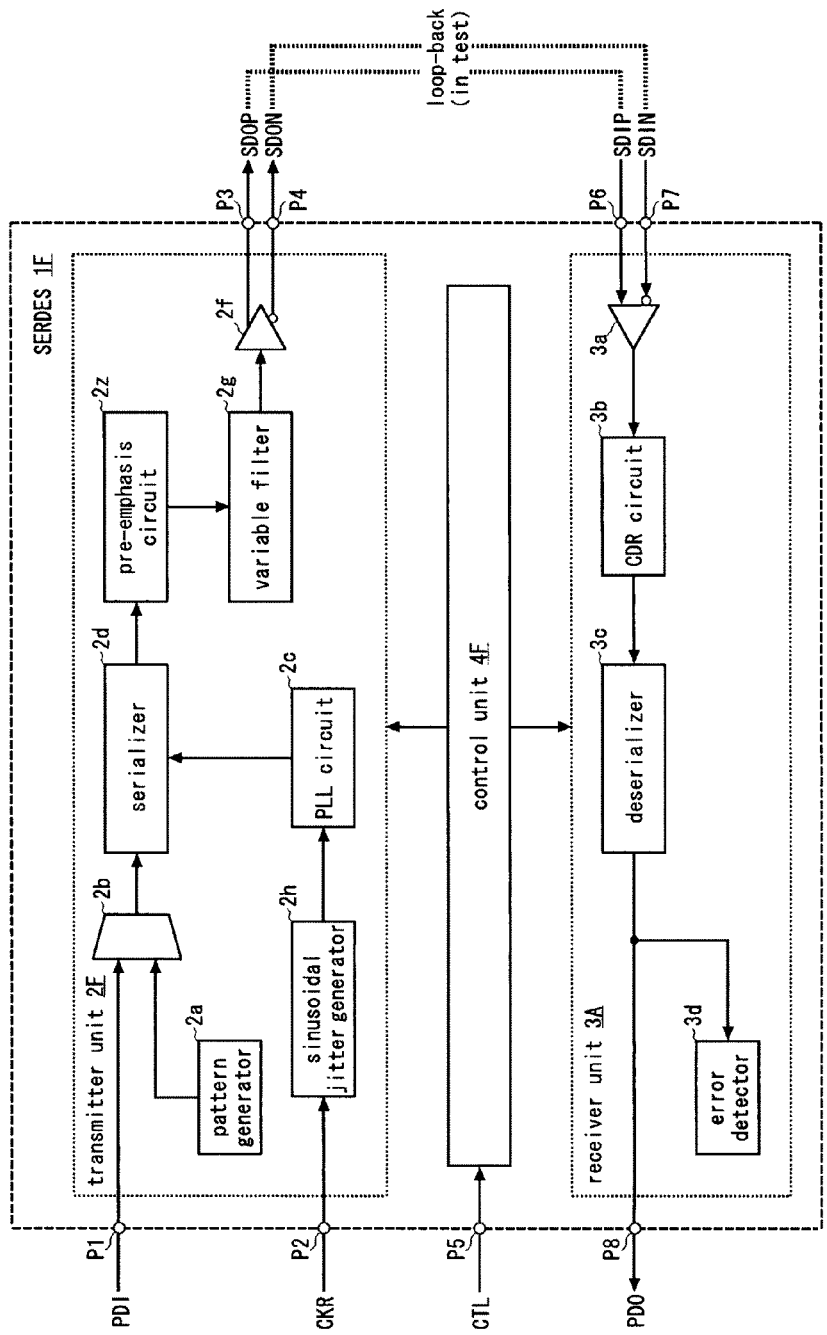
FIG. 14 is a block diagram showing a sixth embodiment.

FIG. 14 shows a sixth embodiment. Hereinafter, in the following description of the sixth embodiment (FIG. 14), the same elements as the elements described in the first, second, and third embodiments (FIG. 8, FIG. 10, and FIG. 11) will be denoted by the same reference numerals and symbols as those used in the first, second, and third embodiments, and detailed description thereof will be omitted. A SERDES 1F includes a transmitter unit 2F, the receiver unit 3A (first embodiment), and a control unit 4F. The transmitter unit 2F is structured such that in the transmitter unit 2B (second embodiment), the sinusoidal jitter generator 2$h$ (third embodiment) is additionally provided between the external pin P2 and the PLL circuit 2$c$. The control unit 4F executes the same operation as that of the control unit 4B (second embodiment), and in addition, also executes an operation of controlling the sinusoidal jitter generator 2$h$ of the transmitter unit 2F. The sixth embodiment as described above can also provide the same effects as those of the first, second, and third embodiments, and therefore, at the time of a back plane transmission margin test and a jitter tolerance test, the tests can be conducted in a more sophisticated manner.

Figure 15:
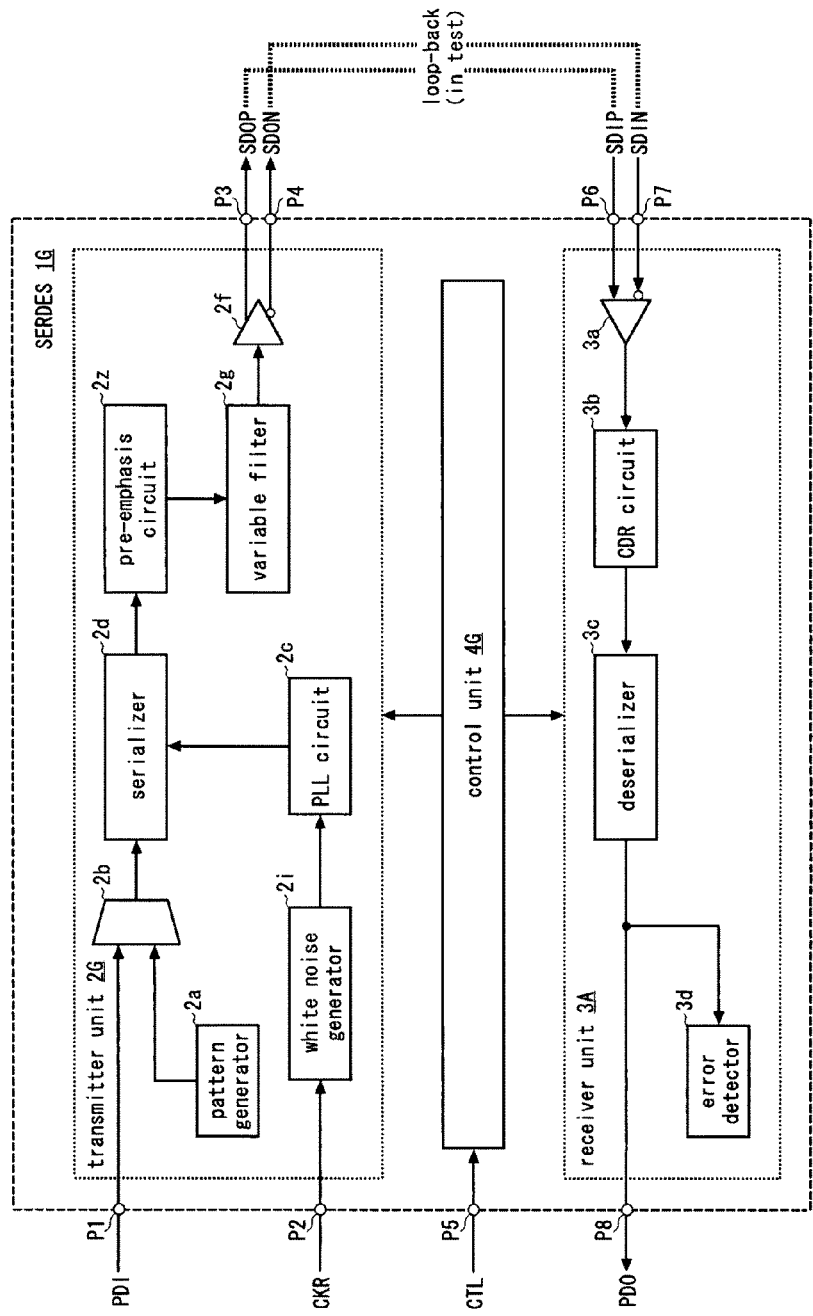
FIG. 15 is a block diagram showing a seventh embodiment.

FIG. 15 shows a seventh embodiment. Hereinafter, in the following description of the seventh embodiment (FIG. 15), the same elements as the elements described in the first, second, and fourth embodiments (FIG. 8, FIG. 10, and FIG. 12) will be denoted by the same reference numerals and symbols as those used in the first, second, and fourth embodiments, and detailed description thereof will be omitted. A SERDES 1G includes a transmitter unit 2G, the receiver unit 3A (first embodiment), and a control unit 4G. The transmitter unit 2G is structured such that in the transmitter unit 2B (second embodiment), the white noise generator 2$i$ (fourth embodiment) is additionally provided between the external pin P2 and the PLL circuit 2$c$. The control unit 4G executes the same operation as that of the control unit 4B (second embodiment), and in addition, also executes an operation of controlling the white noise generator 2$i$ of the transmitter unit 2G. The seventh embodiment as described above can also provide the same effects as those of the first, second, and fourth embodiments, and therefore, at the time of a back plane transmission margin test and a jitter tolerance test, the tests can be conducted in a more sophisticated manner.

Figure 16:
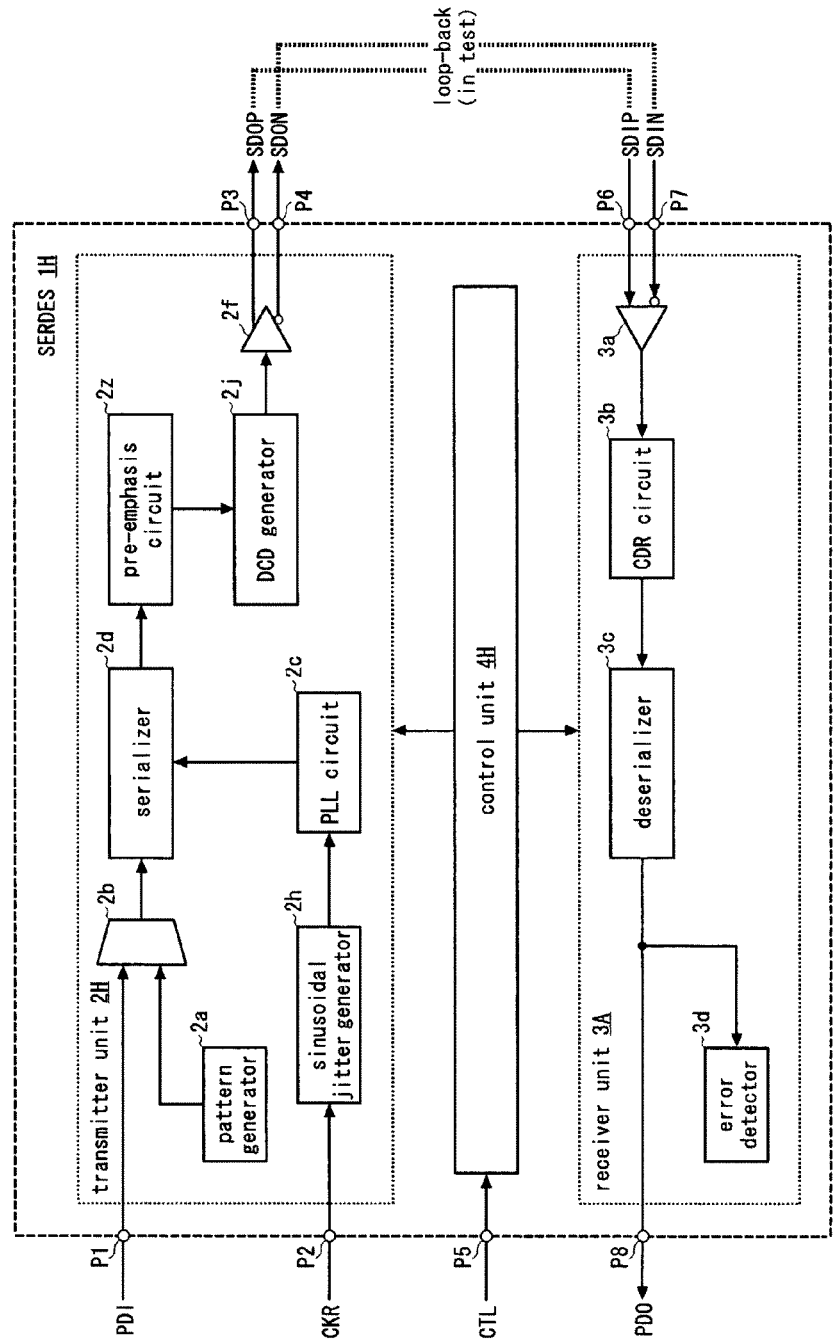
FIG. 16 is a block diagram showing an eighth embodiment.

FIG. 16 shows an eighth embodiment. Hereinafter, in the following description of the eighth embodiment (FIG. 16), the same elements as the elements described in the first, third, and fifth embodiments (FIG. 8, FIG. 11, and FIG. 13) will be denoted by the same reference numerals and symbols as those used in the first, third, and fifth embodiments, and detailed description thereof will be omitted. A SERDES 1H includes a transmitter unit 2H, the receiver unit 3A (first embodiment), and a control unit 4H. The transmitter unit 2H is structured such that in the transmitter unit 2C (third embodiment), the DCD generator 2$j$ (fifth embodiment) is additionally provided between the pre-emphasis circuit 2$z$ and the driver 2$f$. The control unit 4H executes the same operation as that of the control unit 4C (third embodiment), and in addition, also executes an operation of controlling the DCD generator 2$j$ of the transmitter unit 2H. The eighth embodiment as described above can also provide the same effects as those of the first, third, and fifth embodiments, and therefore, at the time of a back plane transmission margin test and a jitter tolerance test, the tests can be conducted in a more sophisticated manner.

Figure 17:
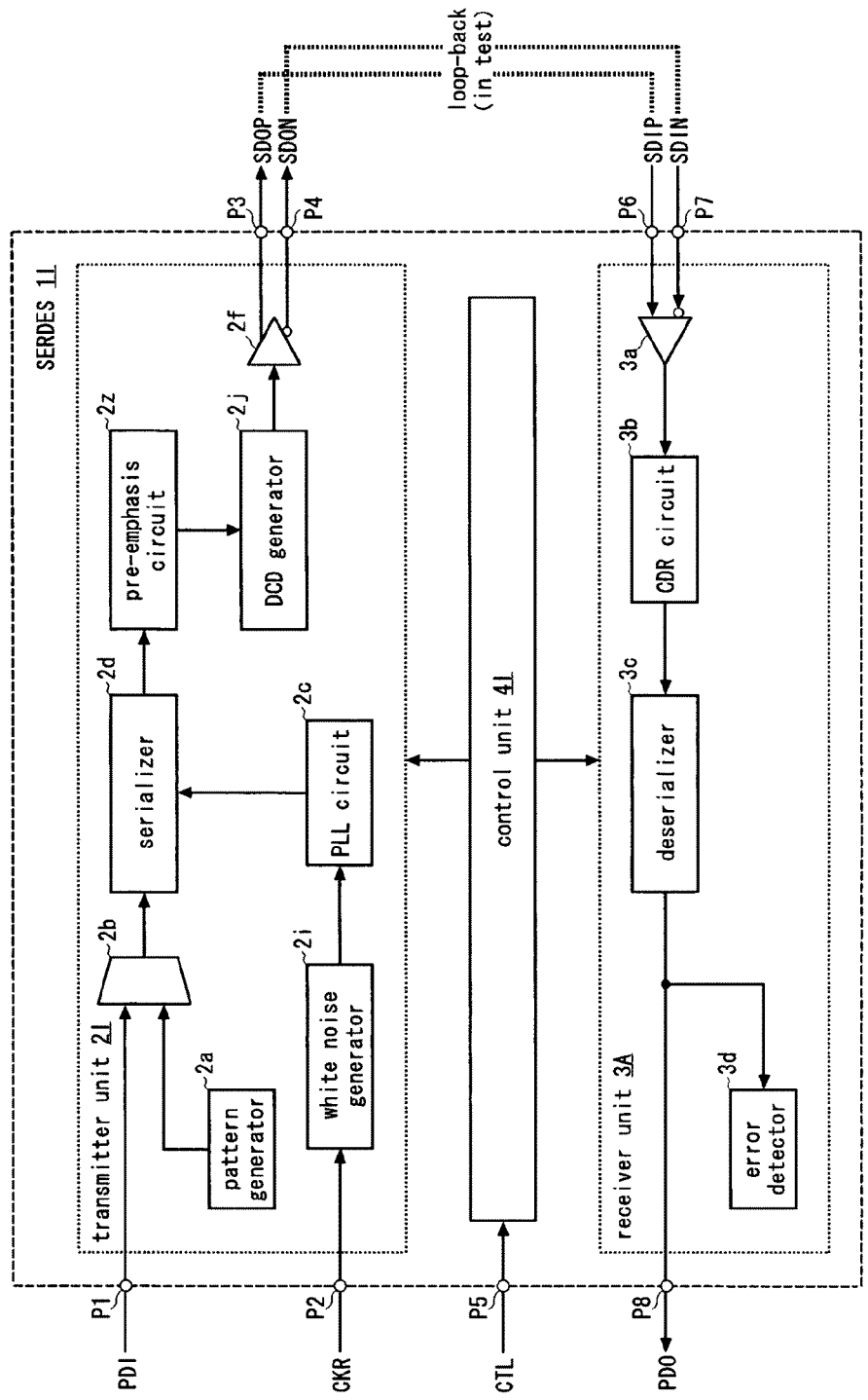
FIG. 17 is a block diagram showing a ninth embodiment.

FIG. 17 shows a ninth embodiment. Hereinafter, in the following description of the ninth embodiment (FIG. 17), the same elements as the elements described in the first, fourth, and fifth embodiments (FIG. 8, FIG. 12, and FIG. 13) will be denoted by the same reference numerals and symbols as those used in the first, fourth, and fifth embodiments, and detailed description thereof will be omitted. A SERDES 1I includes a transmitter unit 2I, the receiver unit 3A (first embodiment), and a control unit 4I. The transmitter unit 2I is structured such that in the transmitter unit 2D (fourth embodiment), the DCD generator 2$j$ (fifth embodiment) is additionally provided between the pre-emphasis circuit 2$z$ and the driver 2$f$. The control unit 4I executes the same operation as that of the control unit 4D (fourth embodiment), and in addition, also executes an operation of controlling the DCD generator 2$j$ of the transmitter unit 2I. The ninth embodiment as described above can also provide the same effects as those of the first, fourth, and fifth embodiments, and therefore, at the time of a back plane transmission margin test and a jitter tolerance test, the tests can be conducted in a more sophisticated manner.

Figure 18:
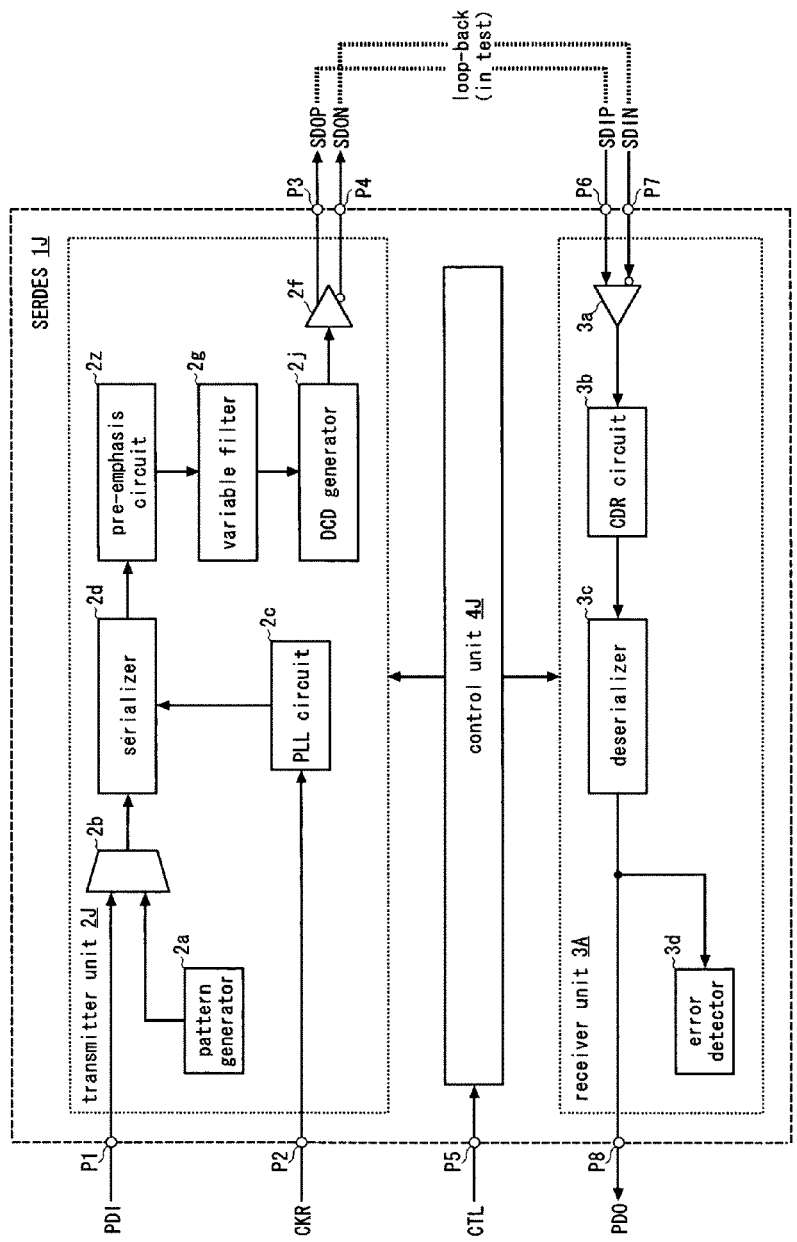
FIG. 18 is a block diagram showing a tenth embodiment.

FIG. 18 shows a tenth embodiment. Hereinafter, in the following description of the tenth embodiment (FIG. 18), the same elements as the elements described in the first, second, and fifth embodiments (FIG. 8, FIG. 10, and FIG. 13) will be denoted by the same reference numerals and symbols as those used in the first, second, and fifth embodiments, and detailed description thereof will be omitted. A SERDES 1J includes a transmitter unit 2J, the receiver unit 3A (first embodiment), and a control unit 4J. The transmitter unit 2J is structured such that in the transmitter unit 2B (second embodiment), the DCD generator 2$j$ (fifth embodiment) is additionally provided between the variable filter 2$g$ and the driver 2$f$. The control unit 4J executes the same operation as that of the control unit 4B (second embodiment), and in addition, also executes an operation of controlling the DCD generator 2$j$ of the transmitter unit 2J. The tenth embodiment as described above can also provide the same effects as those of the first, second, and fifth embodiments, and therefore, at the time of a back plane transmission margin test and a jitter tolerance test, the tests can be conducted in a more sophisticated manner.

Figure 19:
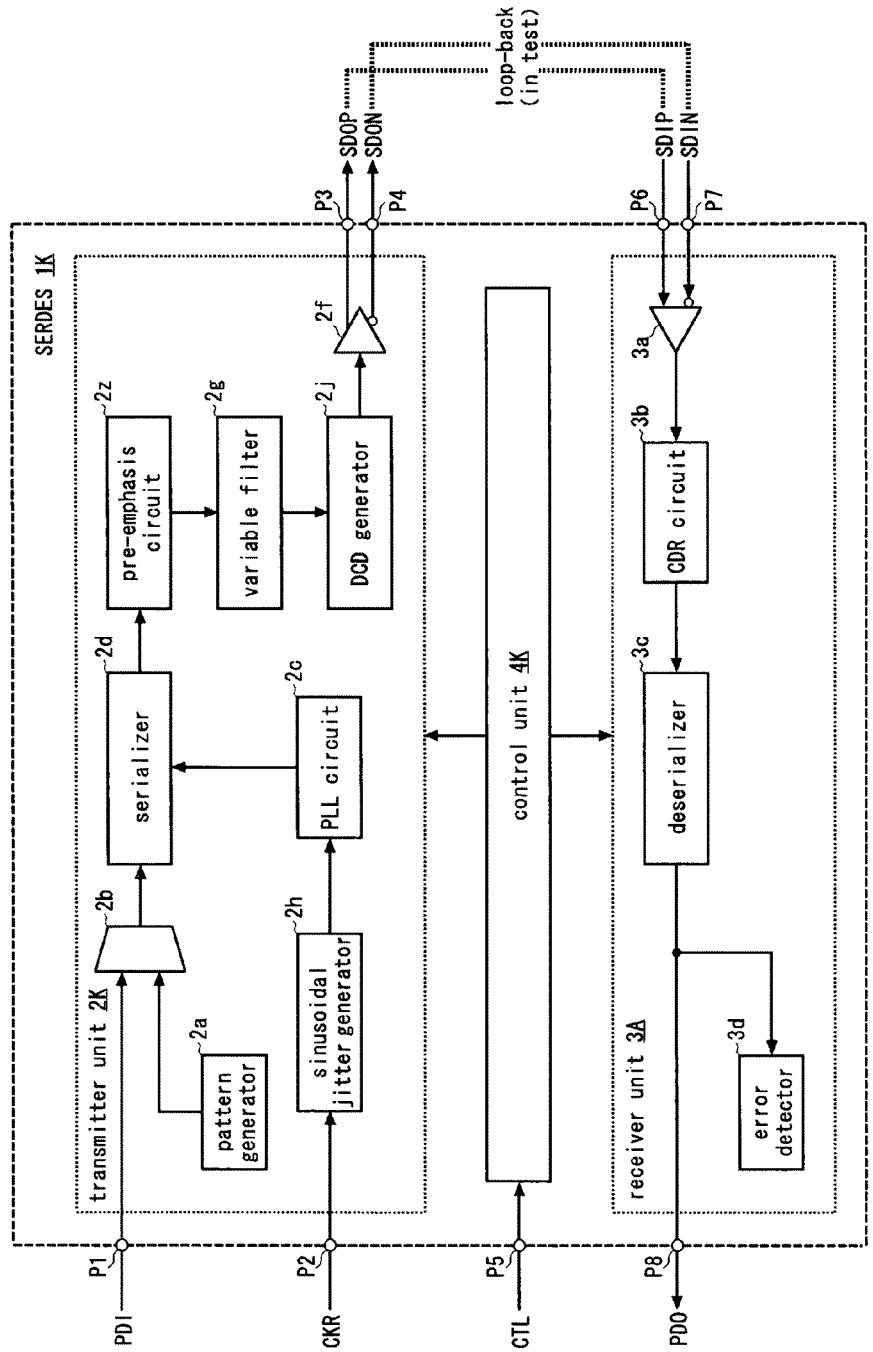
FIG. 19 is a block diagram showing an eleventh embodiment.

FIG. 19 shows an eleventh embodiment. Hereinafter, in the following description of the eleventh embodiment (FIG. 19), the same elements as the elements described in the first, second, third, and fifth embodiments (FIG. 8, FIG. 10, FIG. 11, and FIG. 13) will be denoted by the same reference numerals and symbols as those used in the first, second, third, and fifth embodiments, and detailed description thereof will be omitted. A SERDES 1K includes a transmitter unit 2K, the receiver unit 3A (first embodiment), and a control unit 4K. The transmitter unit 2K is structured such that in the transmitter unit 2J (tenth embodiment), the sinusoidal jitter generator 2h (third embodiment) is additionally provided between the external pin P2 and the PLL circuit 2c. The control unit 4K executes the same operation as that of the control unit 4J (tenth embodiment), and in addition, also executes an operation of controlling the sinusoidal jitter generator 2h of the transmitter unit 2K. The eleventh embodiment as described above can also provide the same effects as those of the first, second, third, and fifth embodiments, and therefore, at the time of a back plane transmission margin test and a jitter tolerance test, the tests can be conducted in a more sophisticated manner.

Figure 20:
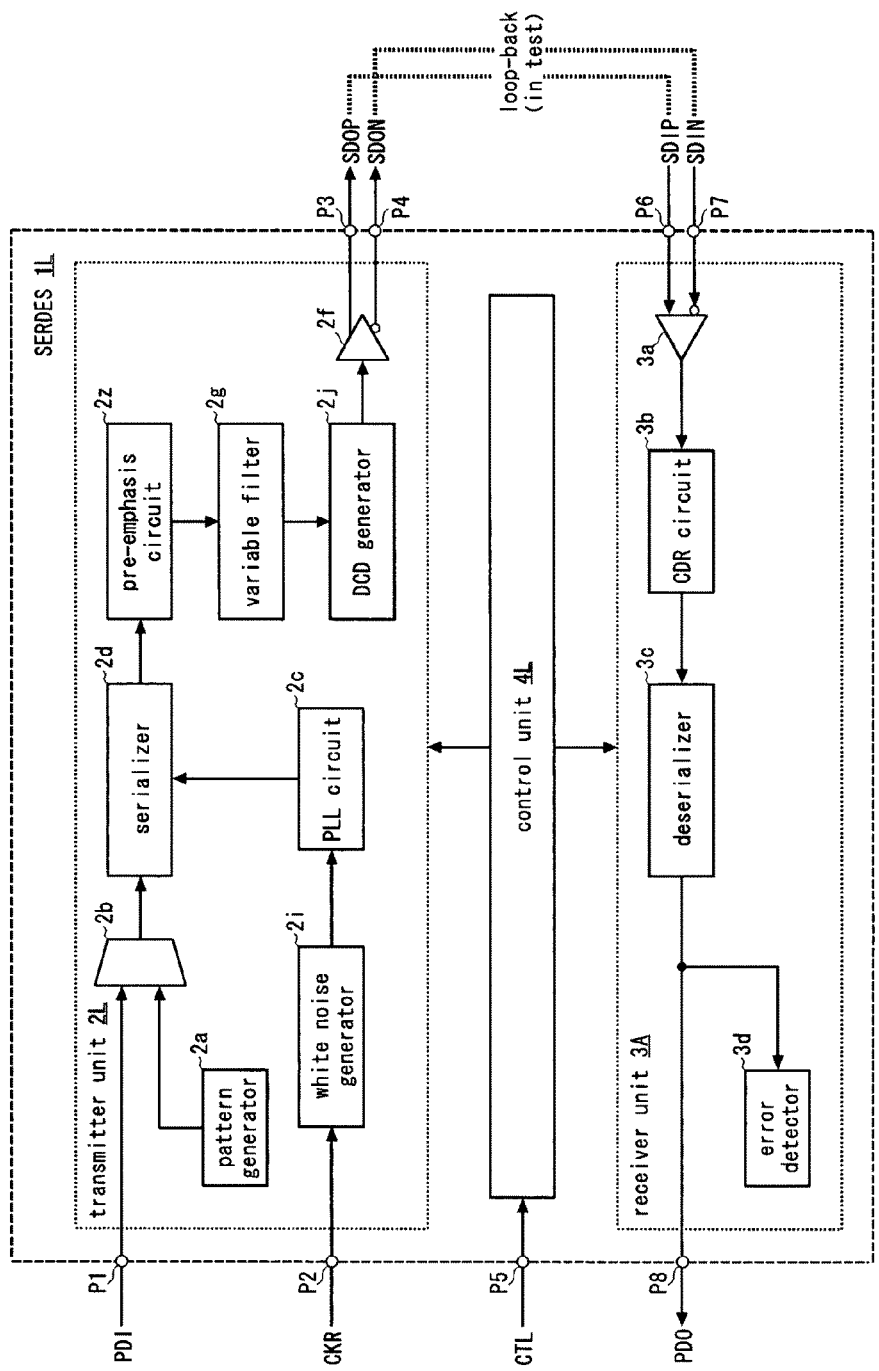
FIG. 20 is a block diagram showing a twelfth embodiment.

FIG. 20 shows a twelfth embodiment. Hereinafter, in the following description of the twelfth embodiment (FIG. 20), the same elements as the elements described in the first, second, fourth, and fifth embodiments (FIG. 8, FIG. 10, FIG. 12, and FIG. 13) will be denoted by the same reference numerals and symbols as those used in the first, second, fourth, and fifth embodiments, and detailed description thereof will be omitted. A SERDES 1L includes a transmitter unit 2L, the receiver unit 3A (first embodiment), and a control unit 4L. The transmitter unit 2L is structured such that in the transmitter unit 2J (tenth embodiment), the white noise generator 2i (fourth embodiment) is additionally provided between the external pin P2 and the PLL circuit 2c. The control unit 4L executes the same operation as that of the control unit 4J (tenth embodiment), and in addition, also executes an operation of controlling the white noise generator 2i of the transmitter unit 2L. The twelfth embodiment as described above can also provide the same effects as those of the first, second, fourth, and fifth embodiments, and therefore, at the time of a back plane transmission margin test and a jitter tolerance test, the tests can be conducted in a more sophisticated manner.

Figure 21:
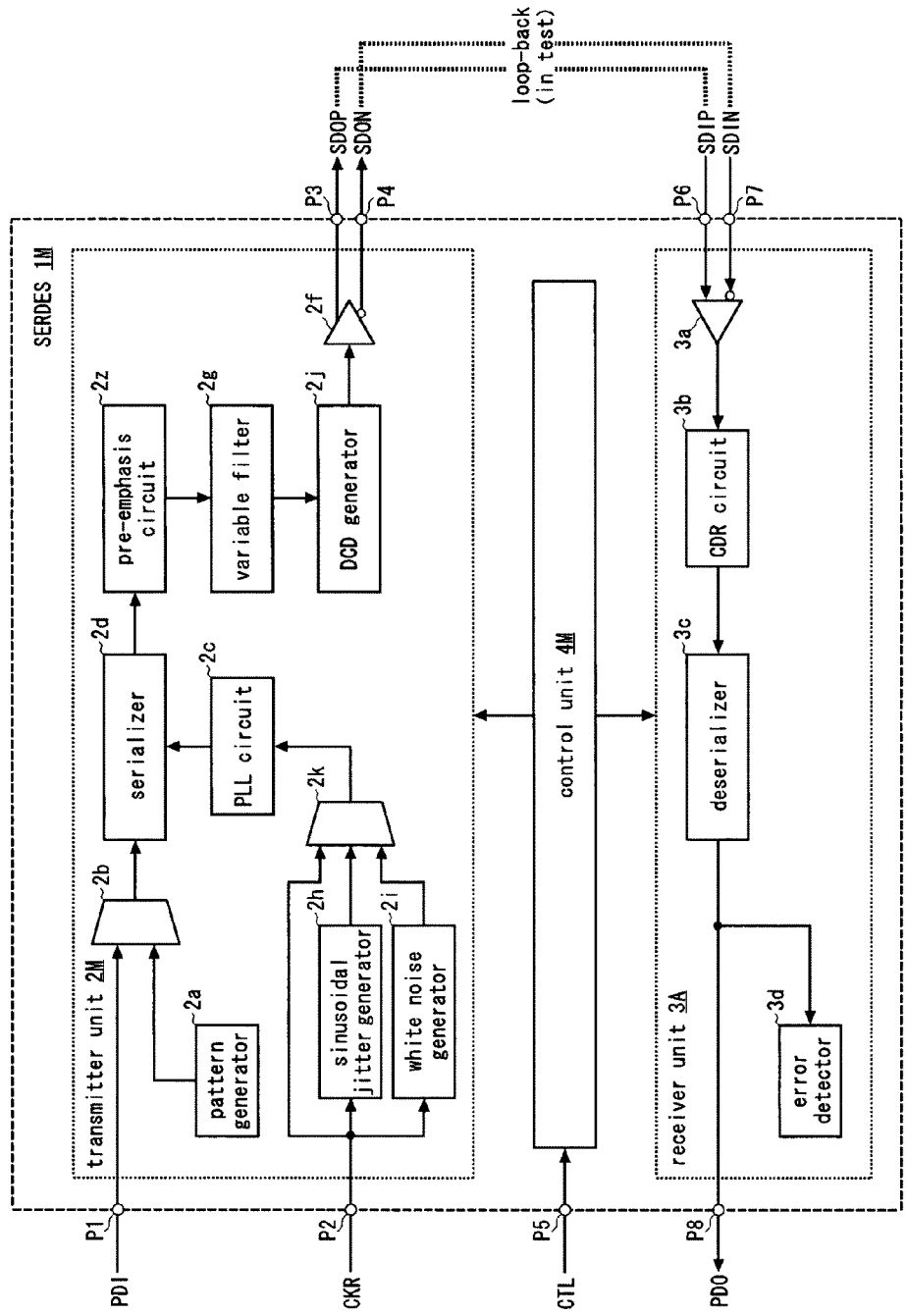
FIG. 21 is a block diagram showing a thirteenth embodiment.

FIG. 21 shows a thirteenth embodiment. Hereinafter, in the following description of the thirteenth embodiment (FIG. 21), the same elements as the elements described in the first, second, third, fourth, and fifth embodiments (FIG. 8, FIG. 10, FIG. 11, FIG. 12, and FIG. 13) will be denoted by the same reference numerals and symbols as those used in the first, second, third, fourth, and fifth embodiments, and detailed description thereof will be omitted. A SERDES 1M includes a transmitter unit 2M, the receiver unit 3A (first embodiment), and a control unit 4M.

The transmitter unit 2M is structured such that in the transmitter unit 2J (tenth embodiment), the sinusoidal jitter generator 2h (third embodiment), the white noise generator 2i (fourth embodiment), and a selector 2k are additionally provided between the external pin P2 and the PLL circuit 2c. According to a command from the control unit 4M, the selector 2k selects one of a reference clock CKR supplied via the external pin P2, a clock supplied from the sinusoidal jitter generator 2h, and a clock supplied from the white noise generator 2i to supply the selected clock to the PLL circuit 2c.

The control unit 4M executes the same operation as that of the control unit 4J (tenth embodiment), and in addition, also executes an operation of controlling the sinusoidal jitter generator 2h, the white noise generator 2i, and the selector 2k of the transmitter unit 2M. The thirteenth embodiment as described above can also provide the same effects as those of the first, second, third, fourth, and fifth embodiments, and therefore, at the time of a back plane transmission margin test and a jitter tolerance test, the tests can be conducted in a more sophisticated manner.

Figure 22:
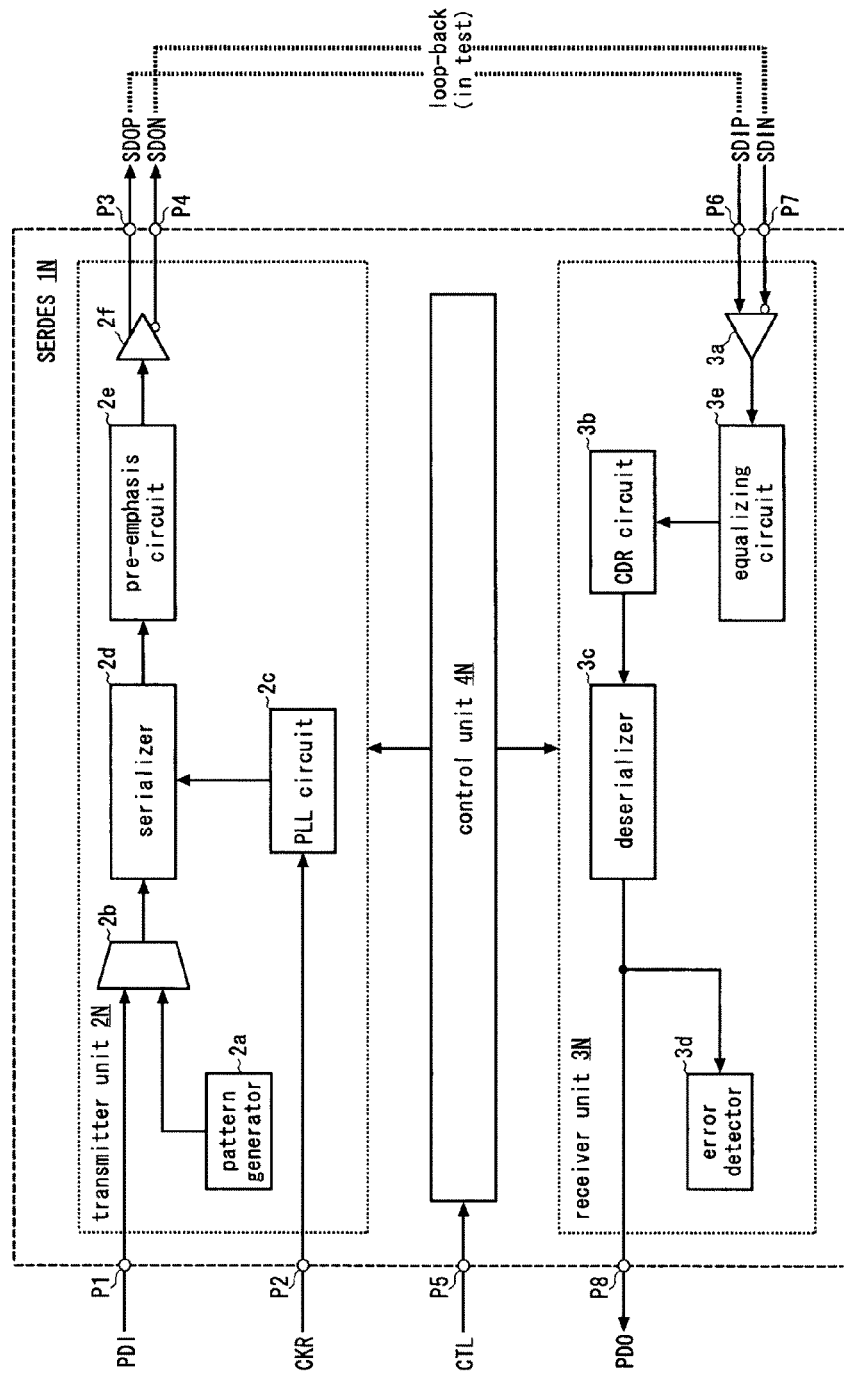
FIG. 22 is a block diagram showing a fourteenth embodiment.
Figure 23:
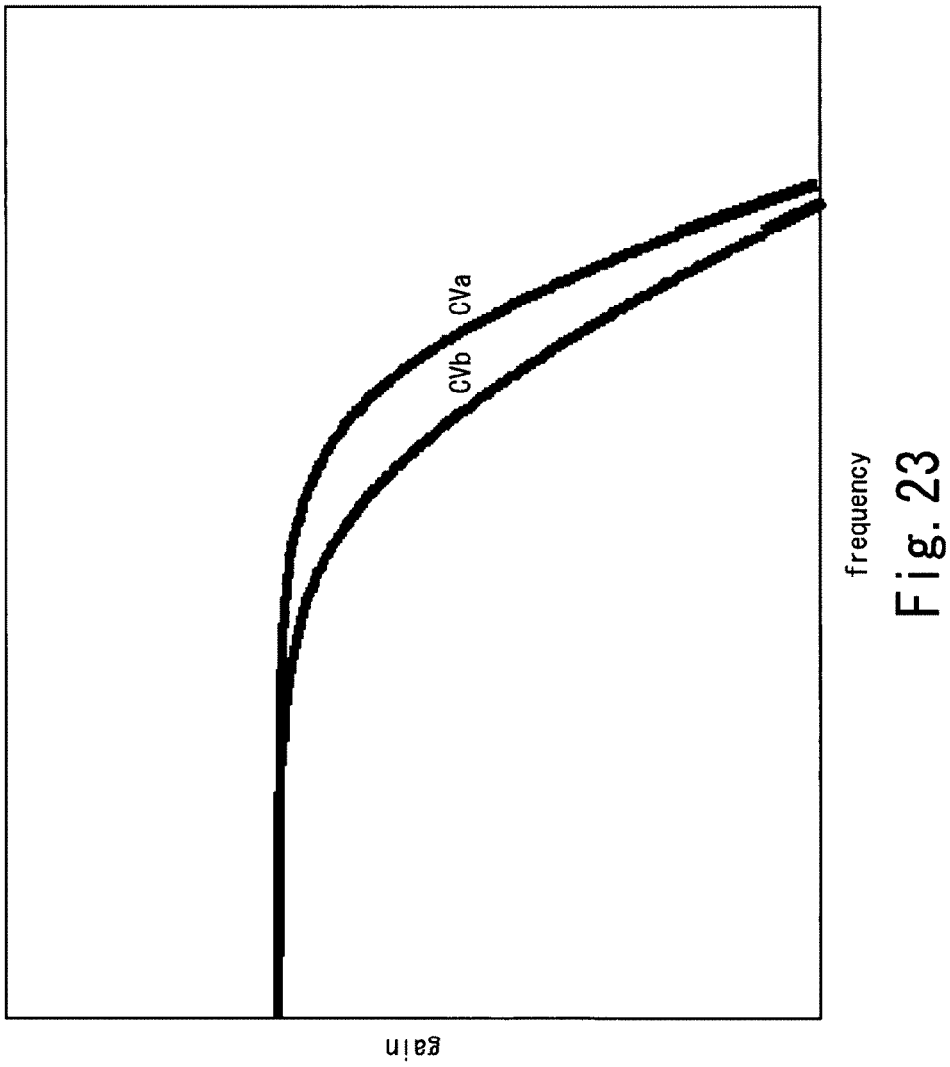
FIG. 23 is an explanatory chart showing an example of frequency characteristics in an essential part of an equalizing circuit in FIG. 22.

FIG. 22 shows a fourteenth embodiment. FIG. 23 shows an example of frequency characteristics in an essential part of an equalizing circuit in FIG. 22. Hereinafter, in the following description of the fourteenth embodiment (FIG. 22), the same elements as the elements described in FIG. 6 will be denoted by the same reference numerals and symbols as those used in FIG. 6, and detailed description thereof will be omitted. A SERDES 1N includes a transmitter unit 2N, a receiver unit 3N, and a control unit 4N. The transmitter unit 2N, which is the same as the transmitter unit 2 (FIG. 6), includes a pattern generator 2a, a selector 2b, a PLL circuit 2c, a serializer 2d, a pre-emphasis circuit 2e, and a driver 2f.

Figure 4:
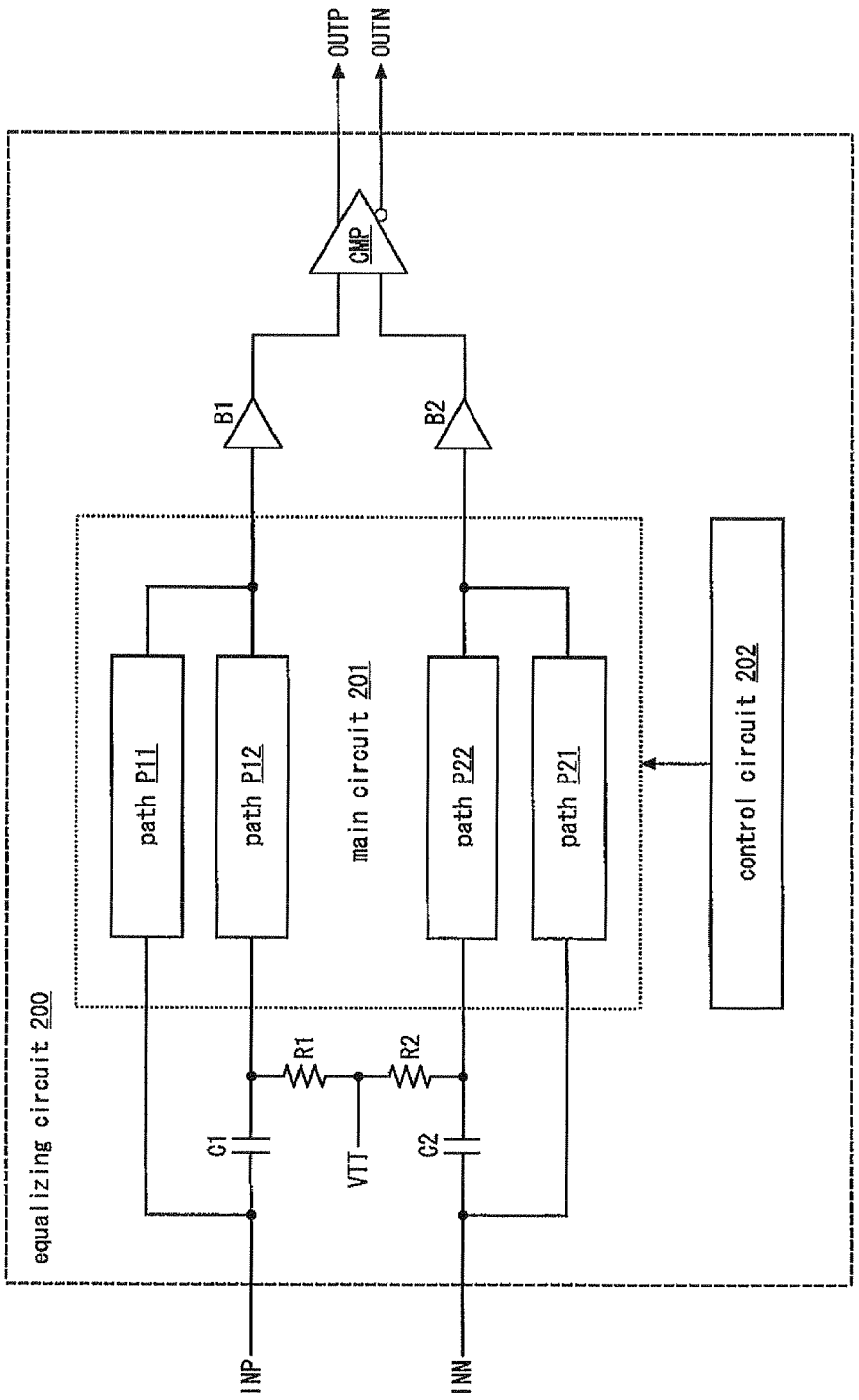
FIG. 4 is a block diagram showing a configuration example of an equalizing circuit.

The receiver unit 3N is structured such that in the receiver unit 3 (FIG. 6), an equalizing circuit 3e is additionally provided between the receiver 3a and the CDR circuit 3b. According to a command from the control unit 4N, the equalizing circuit 3e applies an equalizing process (process to emphasize a high-frequency component) to a serial signal supplied from the receiver 3a to output the resultant serial signal to the CDR circuit 3b. Further, according to a command from the control unit 4N, the equalizing circuit 3e is also capable of executing a waveform deteriorating process of generating waveform deterioration to the serial signal supplied from the receiver 3a, by applying the equalizing process. For example, assuming that the equalizing circuit 3e has the same configuration as that of the equalizing circuit 200 (FIG. 4), in the equalizing circuit 3e, frequency characteristics in paths for amplifying high-frequency components of serial signals supplied from the receiver 3a are controlled, in the waveform deteriorating process, according to frequency characteristics expressed by the characteristic curves CVa, CVb shown in FIG. 23, so that waveform deterioration corresponding to the command from the control unit 4N is generated in a serial signal supplied to the CDR circuit 3b. Incidentally, the command regarding the waveform deteriorating process which is given from the control unit 4N to the equalizing circuit 3e is prescribed according to, for example, transmission distance and transmission loss. The control unit 4N executes the same operation as that of the control unit 4 (FIG. 6), and in addition, also executes an operation of controlling the equalizing process and the waveform deteriorating process of the equalizing circuit 3e.

Here, a method of testing the SERDES 1N will be described. A back plane transmission margin test and a jitter tolerance test of the SERDES 1N are executed in the following manner while the external pins P3, P4 of the SERDES 1N are connected in loop-back to the external pins P6, P7. First, the pattern generator 2a generates a pseudo random pattern, and the pseudo random pattern is supplied as a low-speed parallel signal to the serializer 2d via the selector 2b. Next, the serializer 2d converts the low-speed parallel signal supplied from the selector 2b to a high-speed serial signal synchronous with a high-speed clock supplied from the PLL circuit 2c. Then, the serial signal supplied from the serializer 2d, after subjected to the pre-emphasis process by the pre-emphasis circuit 2e, is outputted to an external part via the driver 2f and the external pins P3, P4. Differential serial signals SDOP, SDON outputted from the external pins P3, P4 of the SERDES 1N are supplied as differential serial signals SDIP, SDIN to the external pins P6, P7 of the SERDES 1N.

A high-speed serial signal (serial signal corresponding to the differential serial signals SDIP, SDIN) supplied from the receiver 3a is subjected to the waveform deteriorating process by the equalizing circuit 3e and its clock and data are recovered by the CDR circuit 3b, and thereafter, the high-speed serial signal is converted to a low-speed parallel signal by the deserializer 3c. Then, the error detector 3d detects a bit error rate of the low-speed parallel signal supplied from the deserializer 3c. At this time, in a case of the back plane transmission margin test, the waveform deteriorating process in the equalizing circuit 3e is executed for each transmission distance, and the maximum transmission distance when the bit error rate detected by the error detector 3d is a predetermined value (for example, 10 to the power of −12) or less is measured. Further, in a case of the jitter tolerance test, it is also possible, for example, to measure an XAUI standard jitter tolerance margin by executing the waveform deteriorating process in the equalizing circuit 3e in accordance with an eye mask prescribed by the XAUI standard.

In the fourteenth embodiment as described above, when the back plane transmission margin test and the jitter tolerance test of the SERDES 1N are conducted, the equalizing circuit 3e can reproduce the waveform deterioration of the differential serial signals SDIP, SDIN due to the signal transmission. Therefore, as in the first embodiment, it is possible to easily conduct the back plane transmission margin test and the jitter tolerance test only by feeding back the differential serial signals SDOP, SDON as the differential serial signals SDIP, SDIN without using any expensive testing apparatus such as a BERT.

Figure 24:
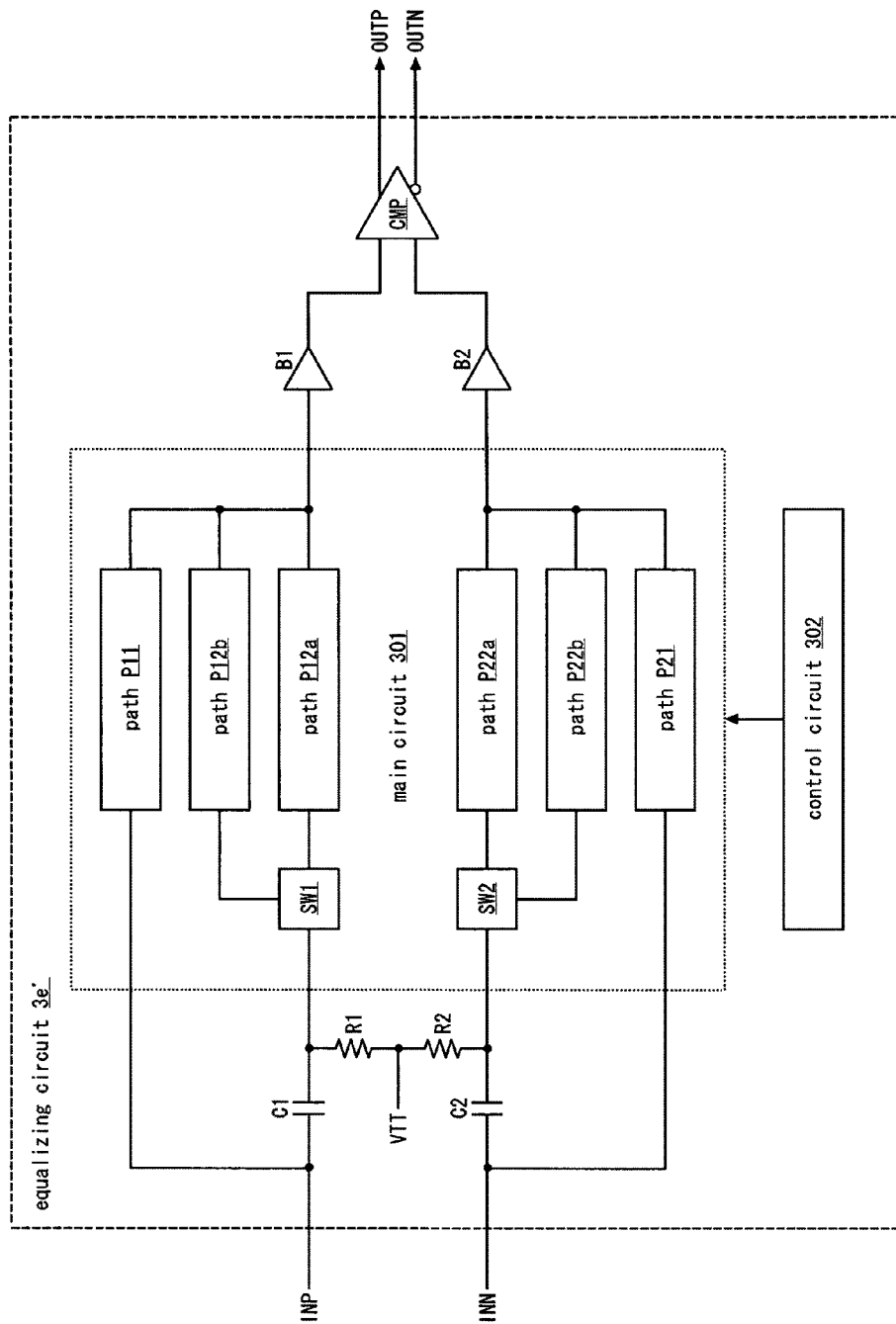
FIG. 24 is a block diagram showing a fifteenth embodiment.

FIG. 24 shows a fifteenth embodiment. A SERDES in the fifteenth embodiment is the same as the SERDES 1N (fourteenth embodiment) except in that its equalizing circuit is different. An equalizing circuit 3e' in the fifteenth embodiment includes a main circuit 301 and a control circuit 302. The main circuit 301 includes: a path P11 for transmitting a low-frequency component of a serial signal INP; a path P12a for amplifying a high-frequency component of the serial signal INP; a path P12b for attenuating the high-frequency component of the serial signal INP; and a switch SW1 for supplying the serial signal INP to one of the paths P12a, P12b. The main circuit 301 further includes: a path P21 for transmitting a low-frequency component of a serial signal INN; a path P22a for amplifying a high-frequency component of the serial signal INN; a path P22b for attenuating the high-frequency component of the serial signal INN; and a switch SW2 for supplying the serial signal INN to one of the paths P22a, P22b. Each of the paths P11, P12a, P12b, P21, P22a, P22b is constituted by a filter, an amplifier, and so on.

Figure 5:
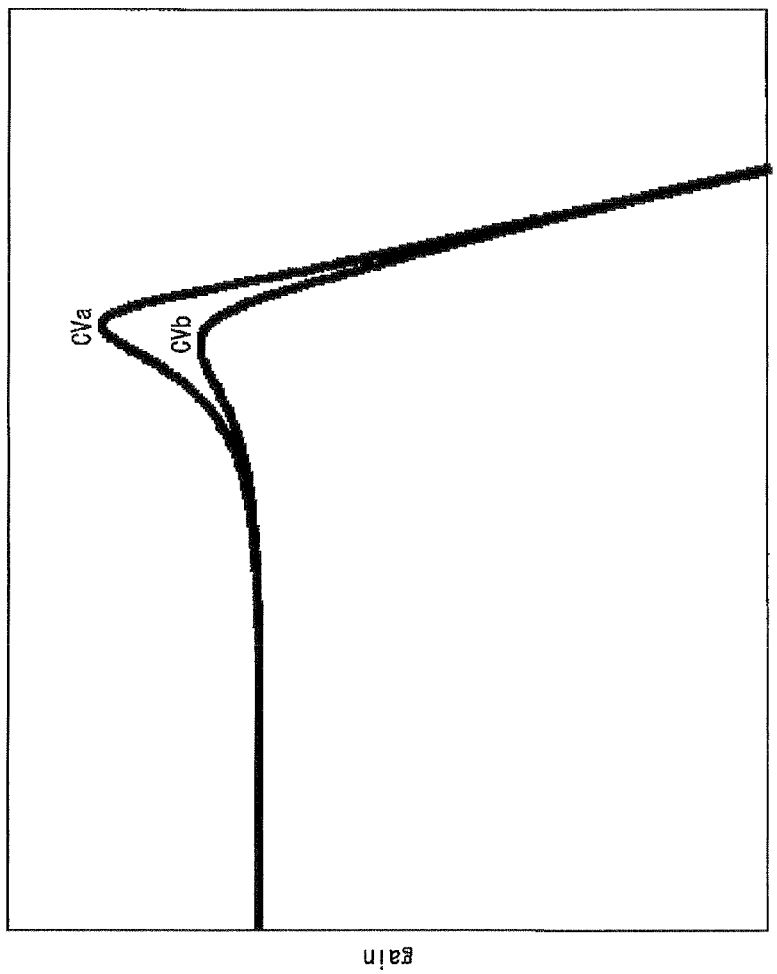
FIG. 5 is an explanatory chart showing an example of frequency characteristics in an essential part of the equalizing circuit in FIG. 4.

In the equalizing process by the equalizing circuit 3e', the control circuit 302 selects the paths P12a, P22a out of the paths P12a, P12b, P22a, P22b of the main circuit 301 and controls the switches SW1, SW2 so that the serial signals INP, INN are supplied to the paths P12a, P22a. In the waveform deteriorating process by the equalizing circuit 3d', the control circuit 302 selects the paths P12b, P22b out of the paths P12a, P12b, P22a, P22b of the main circuit 301 and controls the switches SW1, SW2 so that the serial signals INP, INN are supplied to the paths P12b, P22b. Further, the control circuit 302 controls characteristics of the filters and gains of the amplifiers in the paths P12a, P22a of the main circuit 301, according to the frequency characteristics as expressed by the characteristic curves CVa, CVb shown in FIG. 5. The control circuit 302 controls characteristics of the filters and gains of the amplifiers in the paths P12b, P22b of the main circuit 301 according to the frequency characteristics as expressed by the characteristic curves CVa, CVb shown in FIG. 23.

Incidentally, a capacitor element C1 is connected between a signal line of the serial signal INP and the switch SW1, and a resistor element R1 is connected between a connection node of the capacitor element C1 and the switch SW1 and a voltage line of a voltage VTT. Similarly, a capacitor element C2 is connected between a signal line of the serial signal INN and the switch SW2, and a resistor element R2 is connected between a connection node of the capacitor element C2 and the switch SW2 and the voltage line of the voltage VTT. Further, a signal having passed through the path P11 and a signal having passed through the path selected by the control circuit 302 out of the paths P12a, P12b are synthesized, and the resultant signal is supplied to a buffer B1, and a signal having passed through the path P21 and a signal having passed through the path selected by the control circuit 302 out of the paths P22a, P22b are synthesized and the resultant signal is supplied to a buffer B2. Then, a comparator CMP generates serial signals OUTP, OUTN from output signals of the buffers B1, B2. The fifteenth embodiment as described above can also provide the same effects as those of the fourteenth embodiment.

Figure 25:
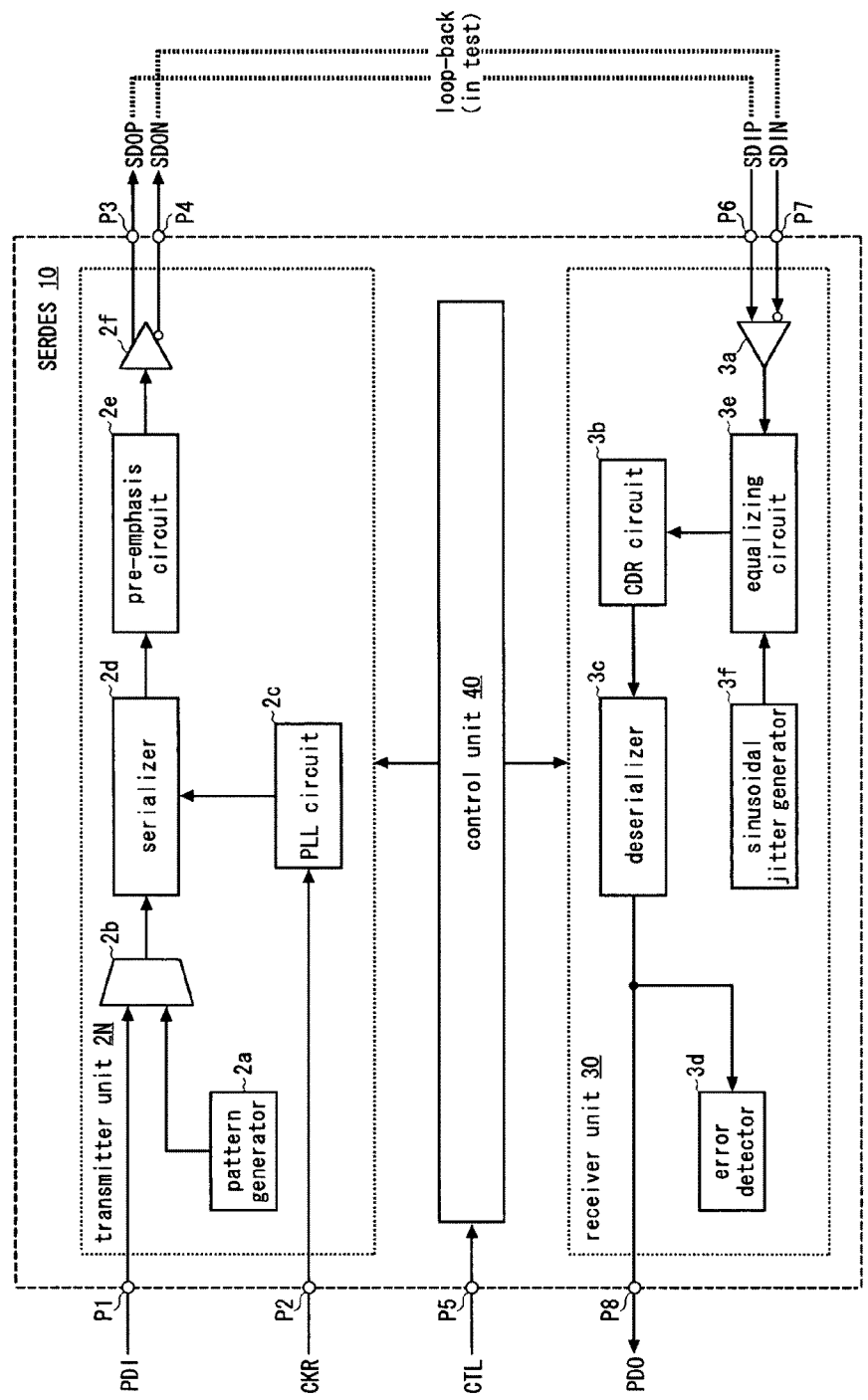
FIG. 25 is a block diagram showing a sixteenth embodiment.

FIG. 25 shows a sixteenth embodiment. Hereinafter, in the following description of the sixteenth embodiment (FIG. 25), the same elements as the elements described in the fourteenth embodiment (FIG. 22) will be denoted by the same reference numerals and symbols as those used in the fourteenth embodiment, and detailed description thereof will be omitted. A SERDES 1O includes the transmitter unit 2N (fourteenth embodiment), a receiver unit 3O, and a control unit 4O.

The receiver unit 3O is structured such that in the receiver unit 3N (fourteenth embodiment), a sinusoidal jitter generator 3f is additionally provided. According to a command from the control unit 4O, the sinusoidal jitter generator 3f outputs a signal for causing sinusoidal jitter to be superimposed on an output signal of the equalizing circuit 3e. Consequently, when the sinusoidal jitter generator 3f is in operation, the sinusoidal jitter in a jitter amount corresponding to the command from the control unit 4O is superimposed on the serial signal supplied from the equalizing circuit 3e to the CDR circuit 3b. The control unit 4O executes the same operation as that of the control unit 4N (fourteenth embodiment), and in addition, also executes an operation of controlling the sinusoidal jitter generator 3f of the receiver unit 3O.

In the sixteenth embodiment as described above, since the sinusoidal jitter generator 3f is provided, it is possible to superimpose a desired cyclic jitter component on the serial signal supplied to the CDR circuit 3b, by controlling the sinusoidal jitter generator 3f via a control signal CTL, at the time of a back plane transmission margin test and a jitter tolerance test, and as a result, the tests can be conducted in more sophisticated manner.

Figure 26:
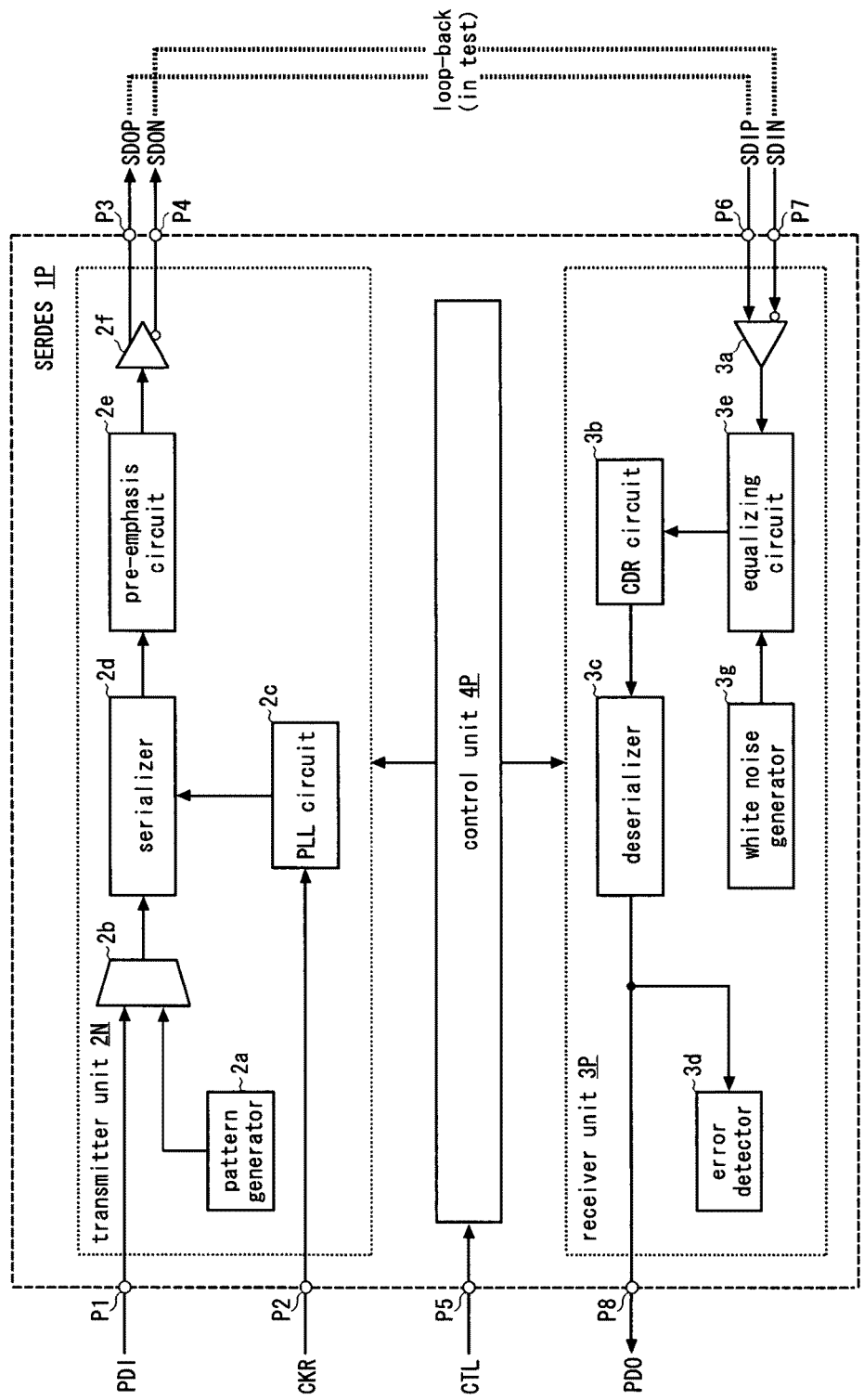
FIG. 26 is a block diagram showing a seventeenth embodiment.

FIG. 26 shows a seventeenth embodiment. Hereinafter, in the following description of the seventeenth embodiment (FIG. 26), the same elements as the elements described in the fourteenth embodiment (FIG. 22) will be denoted by the same reference numerals and symbols as those used in the fourteenth embodiment, and detailed description thereof will be omitted. A SERDES 1P includes the transmitter unit 2N (fourteenth embodiment), a receiver unit 3P, and a control unit 4P.

The receiver unit 3P is structured such that in the receiver unit 3N (fourteenth embodiment), a white noise generator 3g is additionally provided. According to a command from the control unit 4P, the white noise generator 3g outputs a signal for causing white noise to be superimposed on an output signal of the equalizing circuit 3e. Consequently, when the noise generator 3g is in operation, the white noise in a noise amount corresponding to the command from the control unit 4P is superimposed on the serial signal supplied from the equalizing circuit 3e to the CDR circuit 3b. The control unit 4P executes the same operation as that of the control unit 4N (fourteenth embodiment) and in addition, also executes an operation of controlling the white noise generator 3g of the receiver unit 3P.

In the seventeenth embodiment as described above, since the white noise generator 3g is provided, it is possible to superimpose a desired random jitter component on the serial signal supplied to the CDR circuit 3b, by controlling the white noise generator 3g via a control signal CTL, at the time of a back plane transmission margin test and a jitter tolerance test, and as a result, the tests can be conducted in a more sophisticated manner.

Figure 27:
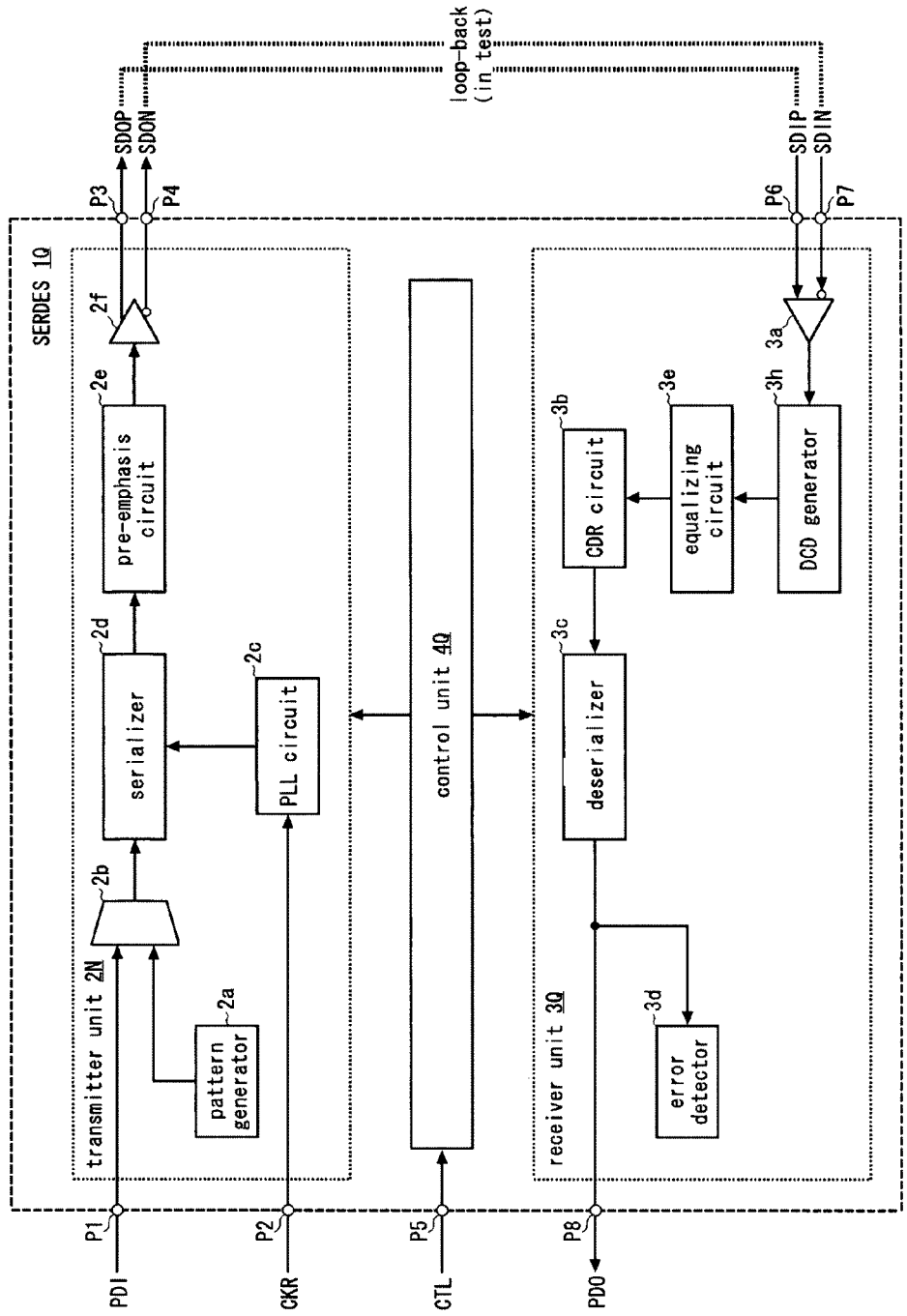
FIG. 27 is a block diagram showing an eighteenth embodiment.

FIG. 27 shows an eighteenth embodiment. Hereinafter, in the following description of the eighteenth embodiment (FIG. 27), the same elements as the elements described in the fourteenth embodiment (FIG. 22) will be denoted by the same reference numerals and symbols as those used in the fourteenth embodiment, and detailed description thereof will be omitted. A SERDES 1Q includes the transmitter unit 2N (fourteenth embodiment), a receiver unit 3Q, and a control unit 4Q.

The receiver unit 3Q is structured such that in the receiver unit 3N (fourteenth embodiment), a DCD generator 3h is additionally provided between the receiver 3a and the equalizing circuit 3e. According to a command from the control unit 4Q, the DCD generator 3h generates duty cycle distortion in a serial signal supplied from the receiver 3a to output the resultant serial signal to the equalizing circuit 3e. Consequently, the duty cycle distortion in a distortion amount corresponding to the command from the control unit 4Q is superimposed on the serial signal supplied to the equalizing circuit 3e, and as a result, the duty cycle distortion occurs in the serial signal supplied to the CDR circuit 3b. The control unit 4Q executes the same operation as that of the control unit 4N (fourteenth embodiment) and in addition, also executes an operation of controlling the DCD generator 3h of the receiver unit 3Q.

In the eighteenth embodiment as described above, since the DCD generator 3h is provided between the receiver 3a and the equalizing circuit 3e, it is possible to superimpose a desired DCD component on the serial signal supplied to the CDR circuit 3b, by controlling the DCD generator 3h via a control signal CTL, at the time of a back plane transmission margin test and a jitter tolerance test, and as a result, the tests can be conducted in a more sophisticated manner.

Figure 28:
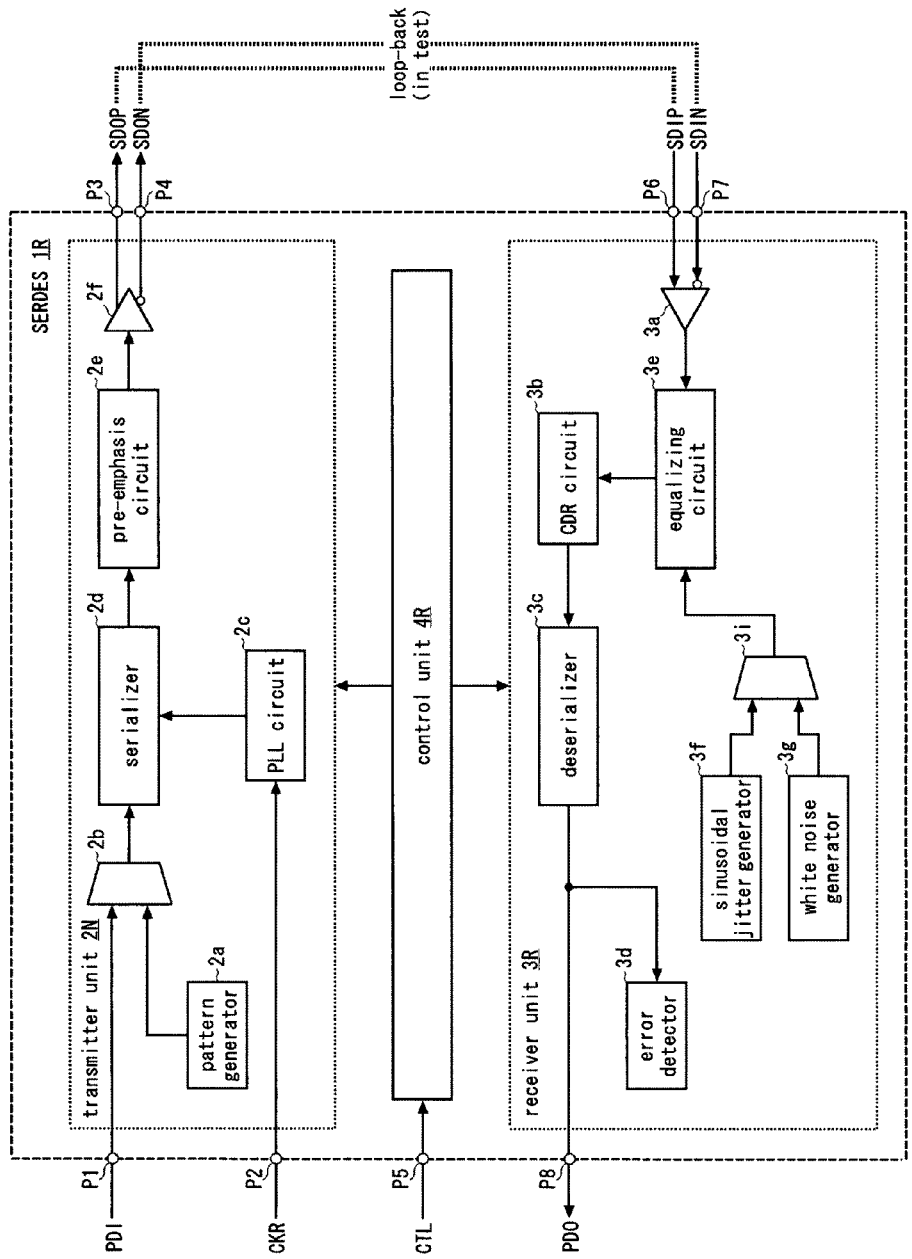
FIG. 28 is a block diagram showing a nineteenth embodiment.

FIG. 28 shows a nineteenth embodiment. Hereinafter, in the following description of the nineteenth embodiment (FIG. 28), the same elements as the elements described in the fourteenth, sixteenth, and seventeenth embodiments (FIG. 22, FIG. 25, and FIG. 26) will be denoted by the same reference numerals and symbols as those used in the fourteenth, sixteenth, and seventeenth embodiments, and detailed description thereof will be omitted.

A SERDES 1R includes the transmitter unit 2N (fourteenth embodiment), a receiver unit 3R, and a control unit 4R.

The receiver unit 3R is structured such that in the receiver unit 3N (fourteenth embodiment), the sinusoidal jitter generator 3f (sixteenth embodiment), the white noise generator 3g (seventeenth embodiment), and a selector 3i are additionally provided. According to a command from the control unit 4R, the selector 3i selects one of a signal supplied from the sinusoidal jitter generator 3f and a signal supplied from the white noise generator 3g and outputs the selected signal to the equalizing circuit 3e. The control unit 4R executes the same operation as that of the control unit 4N (fourteenth embodiment) and in addition, also executes an operation of controlling the sinusoidal jitter generator 3f, the white noise generator 3g, and the selector 3i of the receiver unit 3R. The nineteenth embodiment as described above can provide the same effects as those of the fourteenth, sixteenth, and seventeenth embodiments, and therefore, at the time of a back plane transmission margin test and a jitter tolerance test, the tests can be conducted in a more sophisticated manner.

Figure 29:
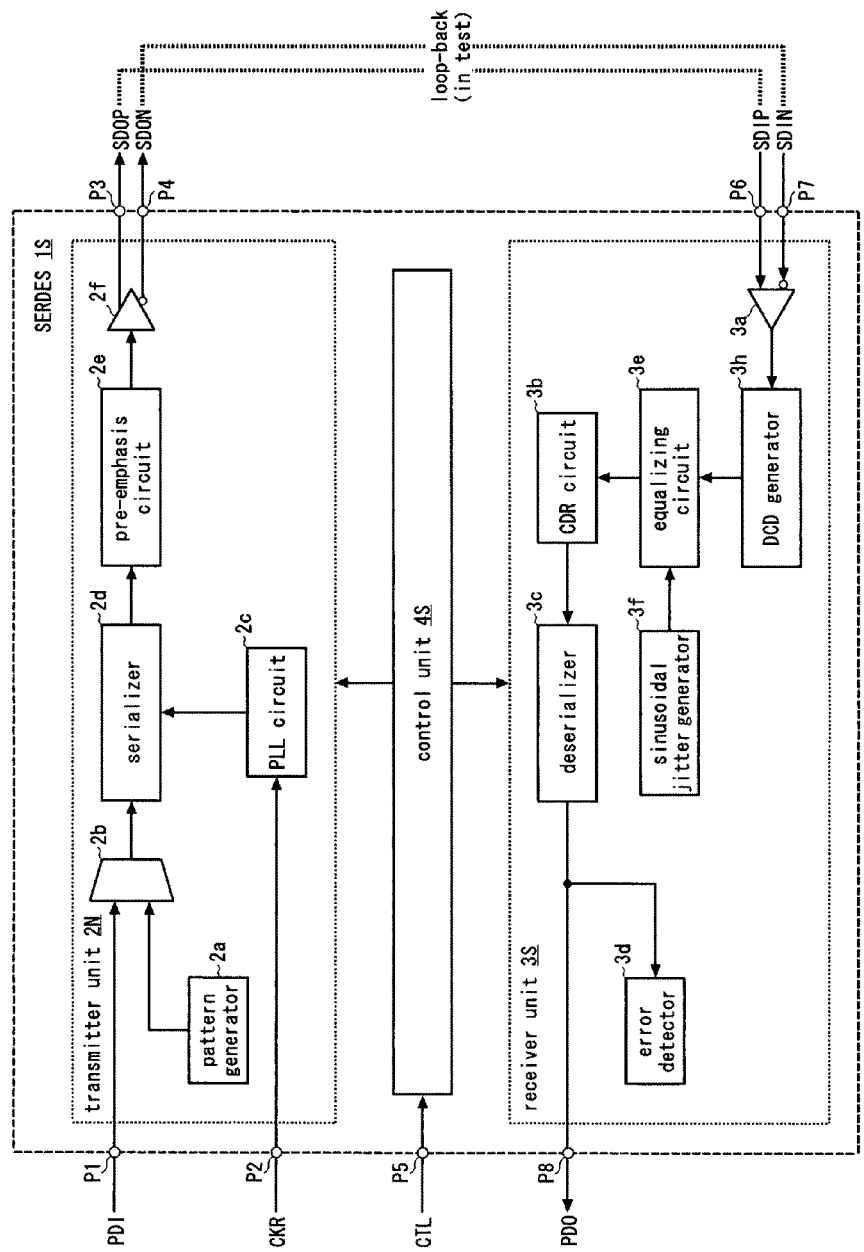
FIG. 29 is a block diagram showing a twentieth embodiment.

FIG. 29 shows a twentieth embodiment. Hereinafter, in the following description of the twentieth embodiment (FIG. 29), the same elements as the elements described in the fourteenth, sixteenth, and eighteenth embodiments (FIG. 22, FIG. 25, and FIG. 27) will be denoted by the same reference numerals and symbols as those used in the fourteenth, sixteenth, and eighteenth embodiments, and detailed description thereof will be omitted. A SERDES 1S includes the transmitter unit 2N (fourteenth embodiment), a receiver unit 3S, and a control unit 4S.

The receiver unit 3S is structured such that in the receiver unit 3O (sixteenth embodiment), the DCD generator 3h (eighteenth embodiment) is additionally provided between the receiver 3a and the equalizing circuit 3e. The control unit 4S executes the same operation as that of the control unit 4O (sixteenth embodiment) and in addition, also executes an operation of controlling the DCD generator 3h of the receiver unit 3S. The twentieth embodiment as described above can provide the same effects as those of the fourteenth, sixteenth, and eighteenth embodiments, and therefore, at the time of a back plane transmission margin test and a jitter tolerance test, the tests can be conducted in a more sophisticated manner.

Figure 30:
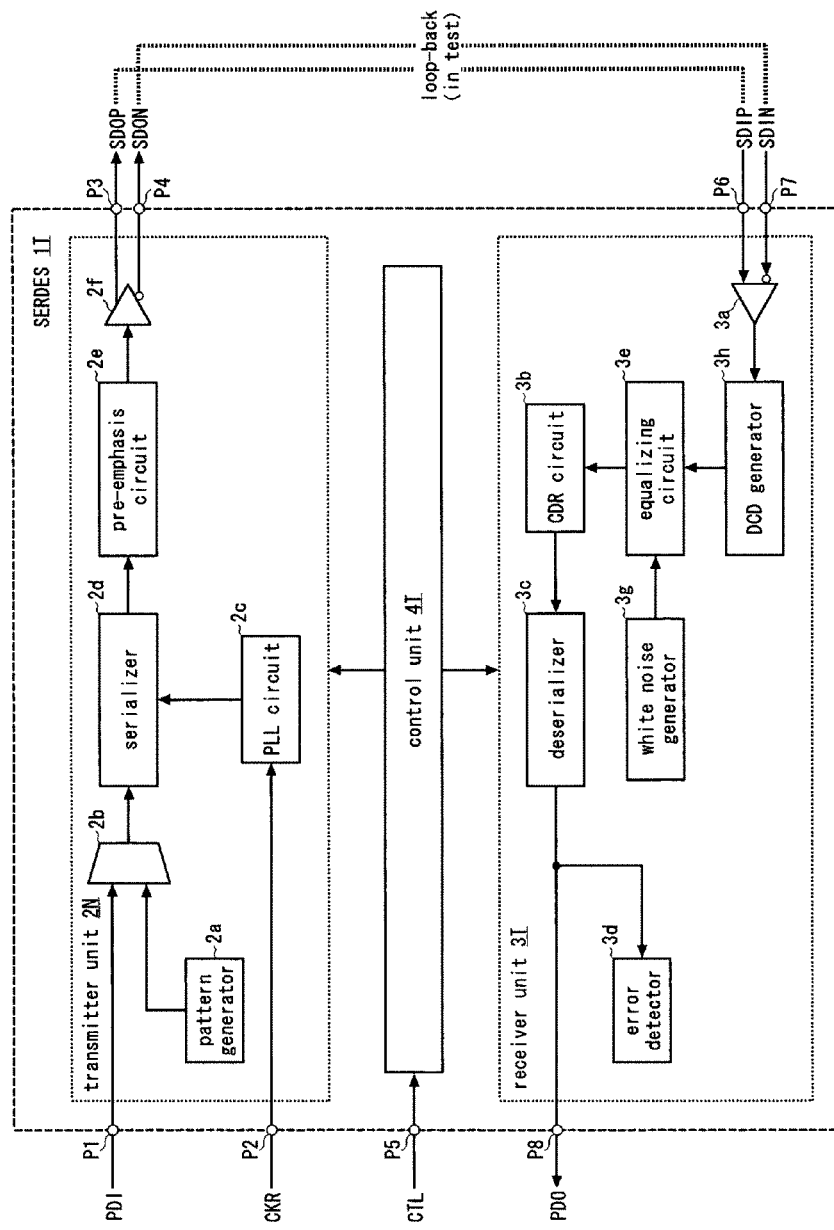
FIG. 30 is a block diagram showing a twenty-first embodiment.

FIG. 30 shows a twenty-first embodiment. Hereinafter, in the following description of the twenty-first embodiment (FIG. 30), the same elements as the elements described in the fourteenth, seventeenth, and eighteenth embodiments (FIG. 22, FIG. 26, and FIG. 27) will be denoted by the same reference numerals and symbols as those used in the fourteenth, seventeenth, and eighteenth embodiments, and detailed description thereof will be omitted. A SERDES 1T includes the transmitter unit 2N (fourteenth embodiment), a receiver unit 3T, and a control unit 4T.

The receiver unit 3T is structured such that in the receiver unit 3P (seventeenth embodiment), the DCD generator 3h (eighteenth embodiment) is additionally provided between the receiver 3a and the equalizing circuit 3e. The control unit 4T executes the same operation as that of the control unit 4P (seventeenth embodiment) and in addition, also executes an operation of controlling the DCD generator 3h of the receiver unit 3T. The twenty-first embodiment as described above can provide the same effects as those of the fourteenth, seventeenth, and eighteenth embodiments can be obtained, and therefore, at the time of a back plane transmission margin test and a jitter tolerance test, the tests can be conducted in a more sophisticated manner.

Figure 31:
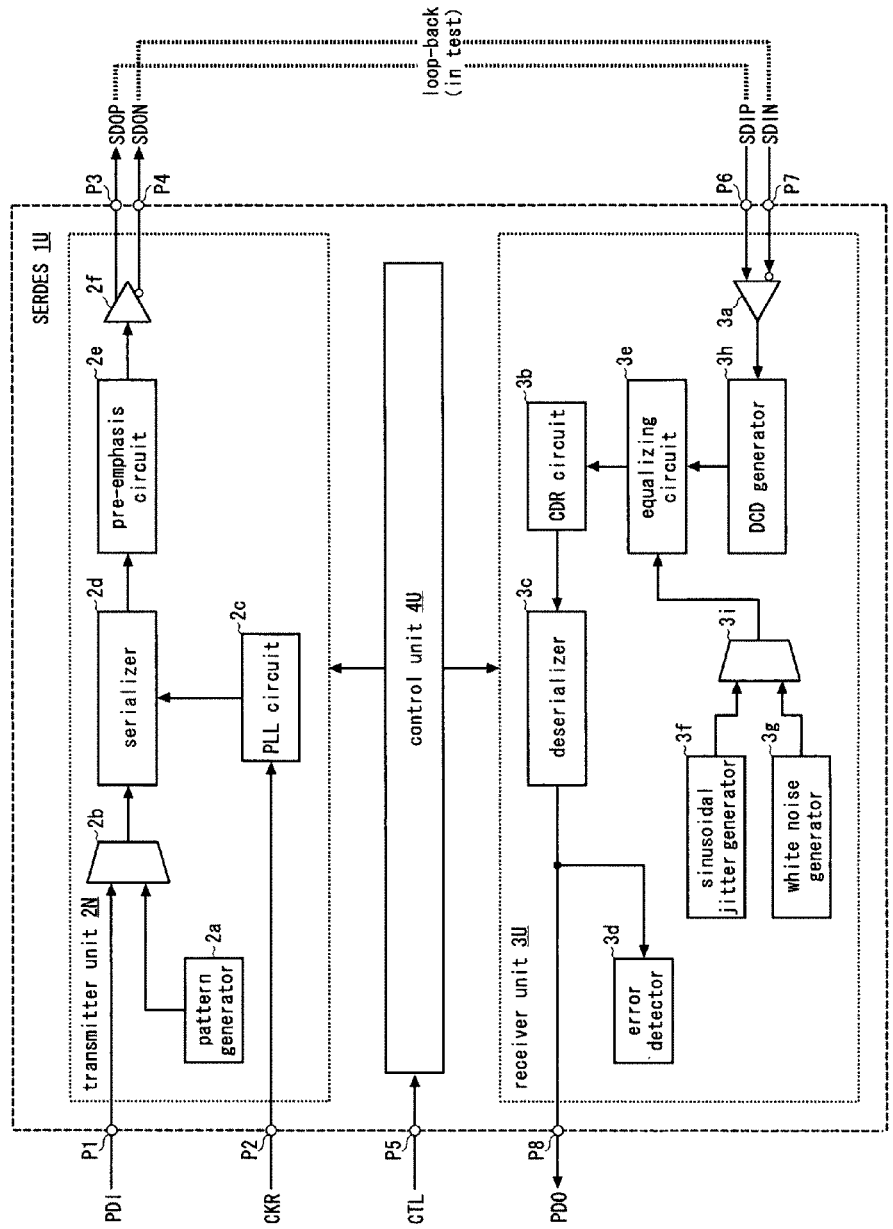
FIG. 31 is a block diagram showing a twenty-second embodiment.

FIG. 31 shows a twenty-second embodiment. Hereinafter, in the following description of the twenty-second embodiment (FIG. 31), the same elements as the elements described in the fourteenth, sixteenth, seventeenth, eighteenth, and nineteenth embodiments (FIG. 22, FIG. 25, FIG. 26, FIG. 27, and FIG. 28) will be denoted by the same reference numerals and symbols as those used in the fourteenth, sixteenth, seventeenth, eighteenth, and nineteenth embodiments, and detailed description thereof will be omitted. A SERDES 1U includes the transmitter unit 2N (fourteenth embodiment), a receiver unit 3U, and a control unit 4U.

The receiver unit 3U is structured such that in the receiver unit 3R (nineteenth embodiment), the DCD generator 3h (eighteenth embodiment) is additionally provided between the receiver 3a and the equalizing circuit 3e. The control unit 4U executes the same operation as that of the control unit 4R (nineteenth embodiment) and in addition, also executes an operation of controlling the DCD generator 3h of the receiver unit 3U. The twenty-second embodiment as described above can provide the same effects as those of the fourteenth, sixteenth, seventeenth, and eighteenth embodiments, and therefore, at the time of a back plane transmission margin test and a jitter tolerance test, the tests can be conducted in a more sophisticated manner.

Figure 32:
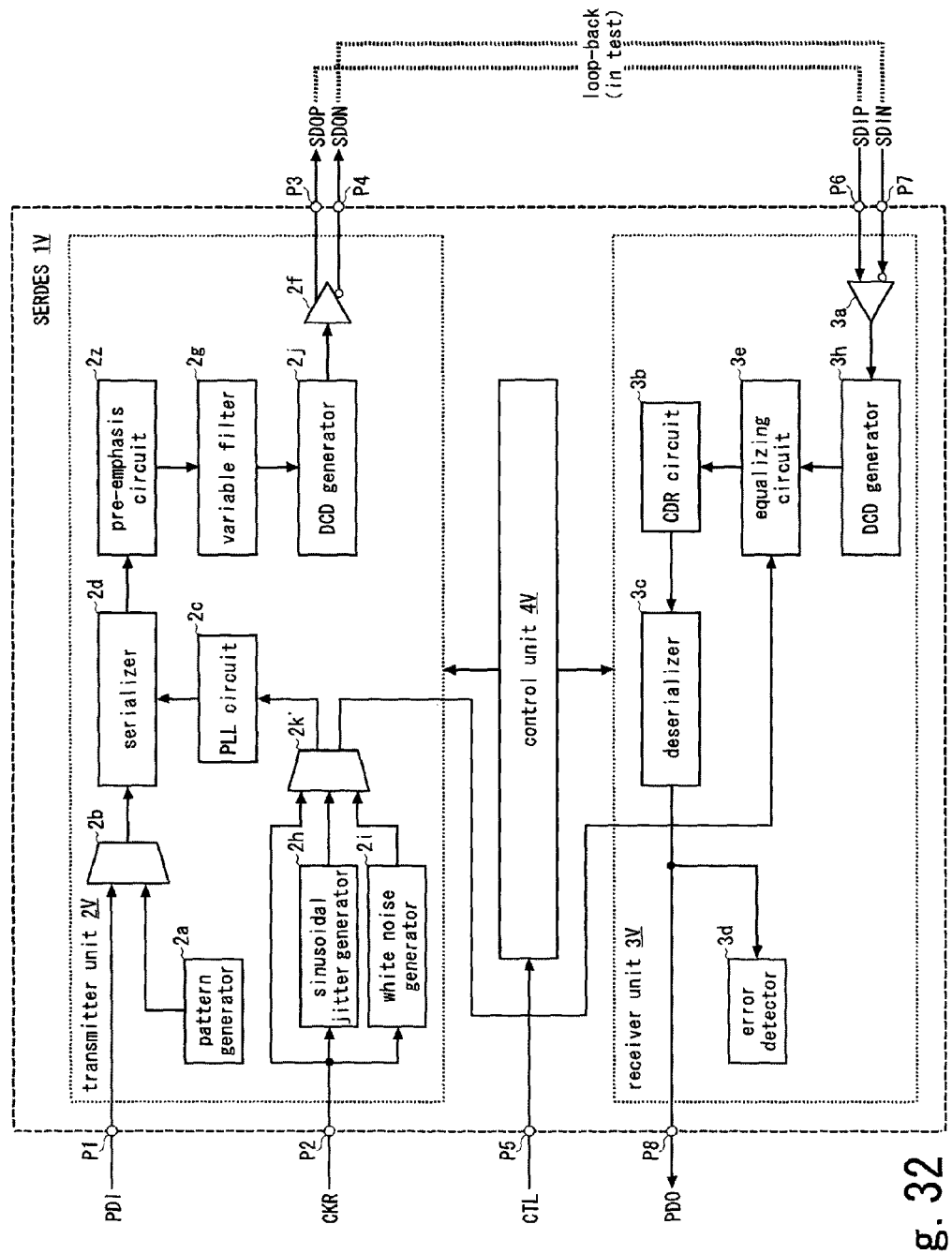
FIG. 32 is a block diagram showing a twenty-third embodiment.

FIG. 32 shows a twenty-third embodiment. Hereinafter, in the following description of the twenty-third embodiment (FIG. 32), the same elements as the elements described in the first, second, third, fourth, fifth, fourteenth, and eighteenth embodiments (FIG. 8, FIG. 10, FIG. 11, FIG. 12, FIG. 13, FIG. 22, and FIG. 27) will be denoted by the same reference numerals and symbols as those used in the first, second, third, fourth, fifth, fourteenth, and eighteenth embodiments, and detailed description thereof will be omitted. A SERDES 1V includes a transmitter unit 2V, a receiver unit 3V, and a control unit 4V.

The transmitter unit 2V is structured such that in the transmitter unit 2M (thirteenth embodiment), a selector 2k' is provided in place of the selector 2k. The selector 2k' executes the same operation as that of the selector 2k (thirteenth embodiment), and in addition, according to a command from the control unit 4V, selects one of a clock supplied from the sinusoidal jitter generator 2h and a clock supplied from the white noise generator 2i to output the selected clock to the equalizing circuit 3e of the receiver unit 3V. The receiver unit 3V is the same as the receiver unit 3Q (eighteenth embodiment) except in that its equalizing circuit 3e is supplied with a signal for causing sinusoidal jitter or white noise to be superimposed on an output signal of the equalizing circuit 3e. Regarding the operation of controlling the transmitter unit 2V, the control unit 4V executes the same operation as that of the control unit 4M (thirteenth embodiment), and in addition, also executes an operation of controlling the selector 2k' in selecting the output signal to the equalizing circuit 3e. Regarding the operation of controlling the receiver unit 3V, the control unit 4V executes the same operation as that of the control unit 4Q (eighteenth embodiment).

The twenty-third embodiment as described above can provide not only the same effects as those of the first, second, third, fourth, and fifth embodiments, but also the same effects as those of the fourteenth, sixteenth, seventeenth, and eighteenth embodiments, and therefore, at the time of a back plane transmission margin test and a jitter tolerance test, the tests can be conducted in a more sophisticated manner.

Figure 33:
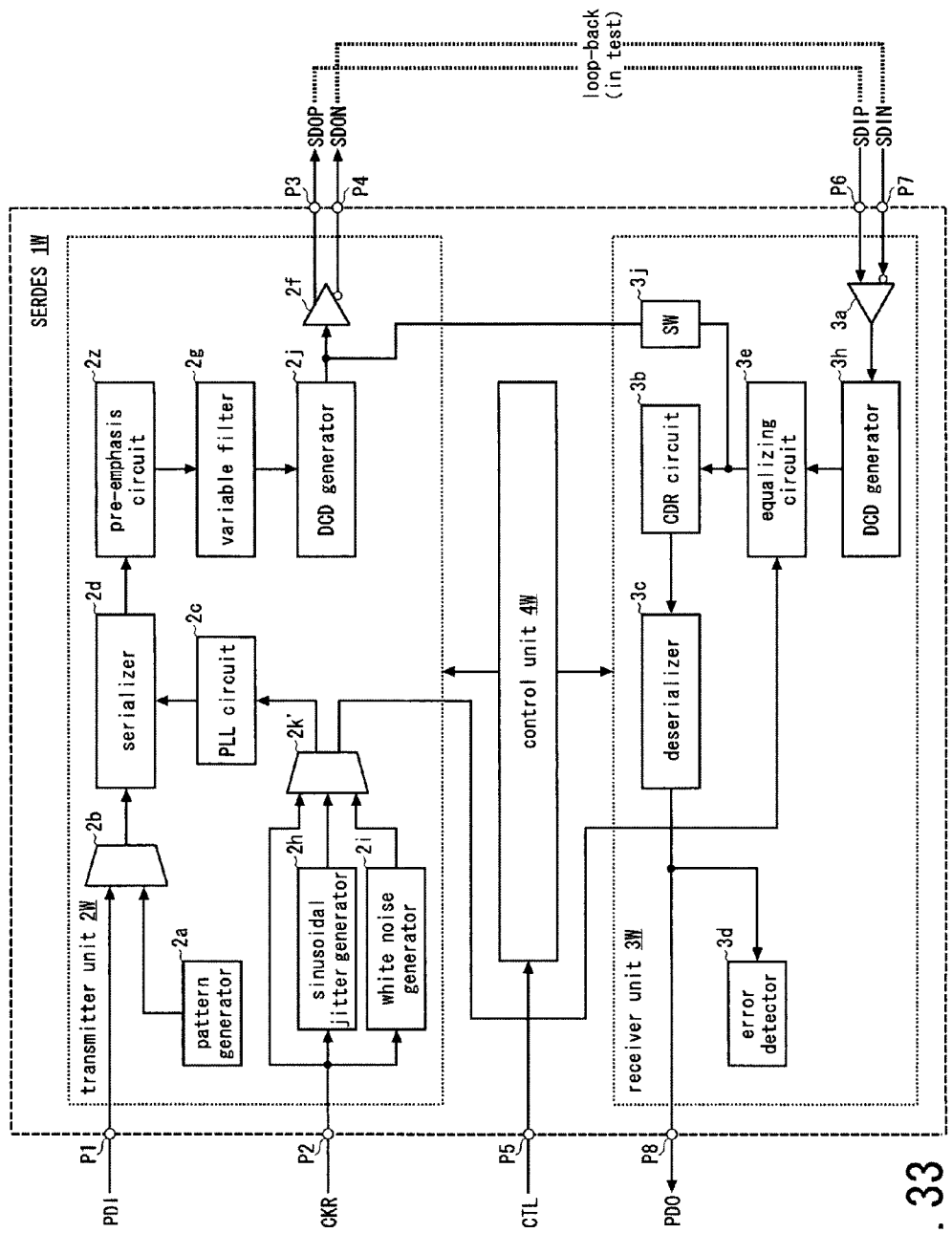
FIG. 33 is a block diagram showing a twenty-fourth embodiment.

FIG. 33 shows a twenty-fourth embodiment. Hereinafter, in the following description of the twenty-fourth embodiment (FIG. 33), the same elements as the elements described in the first, second, third, fourth, fifth, fourteenth, eighteenth, and twenty-third embodiments (FIG. 8, FIG. 10, FIG. 11, FIG. 12, FIG. 13, FIG. 22, FIG. 27, and FIG. 32) will be denoted by the same reference numerals and symbols as those used in the first, second, third, fourth, fifth, fourteenth, eighteenth, and twenty-third embodiments, and detailed description thereof will be omitted. A SERDES 1W includes a transmitter unit 2W, a receiver unit 3W, and a control unit 4W.

The transmitter unit 2W is the same as the transmitter unit 2V (twenty-third embodiment) except in that it includes a path for supplying an output signal of the equalizing circuit 3e of the receiver unit 3W as an input signal of the driver 2f. The receiver unit 3W is structured such that in the receiver unit 3V (twenty-third embodiment), a switch (SW) 3j is additionally provided. In response to a command from the control unit 4W, the switch 3j validates the path for supplying the output signal of the equalizing circuit 3e as the input signal of the driver 2f of the transmitter unit 2W. The control unit 4W executes the same operation as that of the control unit 4V (twenty-third embodiment), and in addition, also executes an operation of controlling the switch 3j of the receiver unit 3W.

In the twenty-fourth embodiment as described above, when the path for supplying the output signal of the equalizing circuit 3e as the input signal of the driver 2f becomes effective, differential signals SDOP, SDON corresponding to a serial signal supplied to the CDR circuit 3b are outputted from the external pins P3, P4. Therefore, before a back plane transmission margin test or a jitter tolerance test is conducted, while the path for supplying the output signal of the equalizing circuit 3e as the input signal of the driver 2f is validated, differential signals SDIP, SDIN are supplied to the external pins P6, P7 by a measurement apparatus or the like, and jitter components of the differential serial signals SDOP, SDON are measured by an oscilloscope or the like provided with a jitter analysis function, and then the circuits involved in waveform deterioration and jitter generation in the receiver unit 3W are controlled via a control signal CTL so that the measurement results become desired jitter amounts. Executing the back plane transmission margin test and the jitter tolerance test based on information of these circuits set at this time makes it possible to improve accuracy of the tests. Incidentally, to control the circuits involved in the waveform deterioration and the jitter generation in the transmitter unit 2W, jitter components of the differential serial signals SDOP, SDON are measured by the oscilloscope provided with the jitter analysis function while the path for supplying the output signal of the equalizing circuit 3e as the input signal of the driver 2f is invalidated, and these circuits are controlled via a control signal CTL so that the measurement results become desired jitter amounts.

The first embodiment (second~thirteenth embodiments) has described the example where the number of channels of the SERDES 1A (1B~1M) is one, but it should be noted that the present invention is not limited to such an embodiment. Another possible structure is, for example, that the number of channels of the SERDES is plural, and a certain channel includes the transmitter unit 2A (2B~2M), the receiver unit 3A, and the control unit 4A (4B~4M), and each of the other channels includes the transmitter unit 2, the receiver unit 3, and the control unit 4 (FIG. 6).

Further, the thirteenth embodiment has described the example where the transmitter unit is structured such that in the transmitter unit 2J (tenth embodiment), the sinusoidal jitter generator 2h (third embodiment), the white noise generator 2i (fourth embodiment), and the selector 2k are additionally provided between the external pin P2 and the PLL circuit 2c, but the present invention is not limited to such an embodiment. For example, the transmitter unit may be structured such that in one of the transmitter unit 2A (first embodiment), the transmitter unit 2B (second embodiment), and the transmitter unit 2E (fifth embodiment), the sinusoidal jitter generator 2h, the white noise generator 2i, and the selector 2k are additionally provided between the external pin P2 and the PLL circuit 2c.

Figure 6:
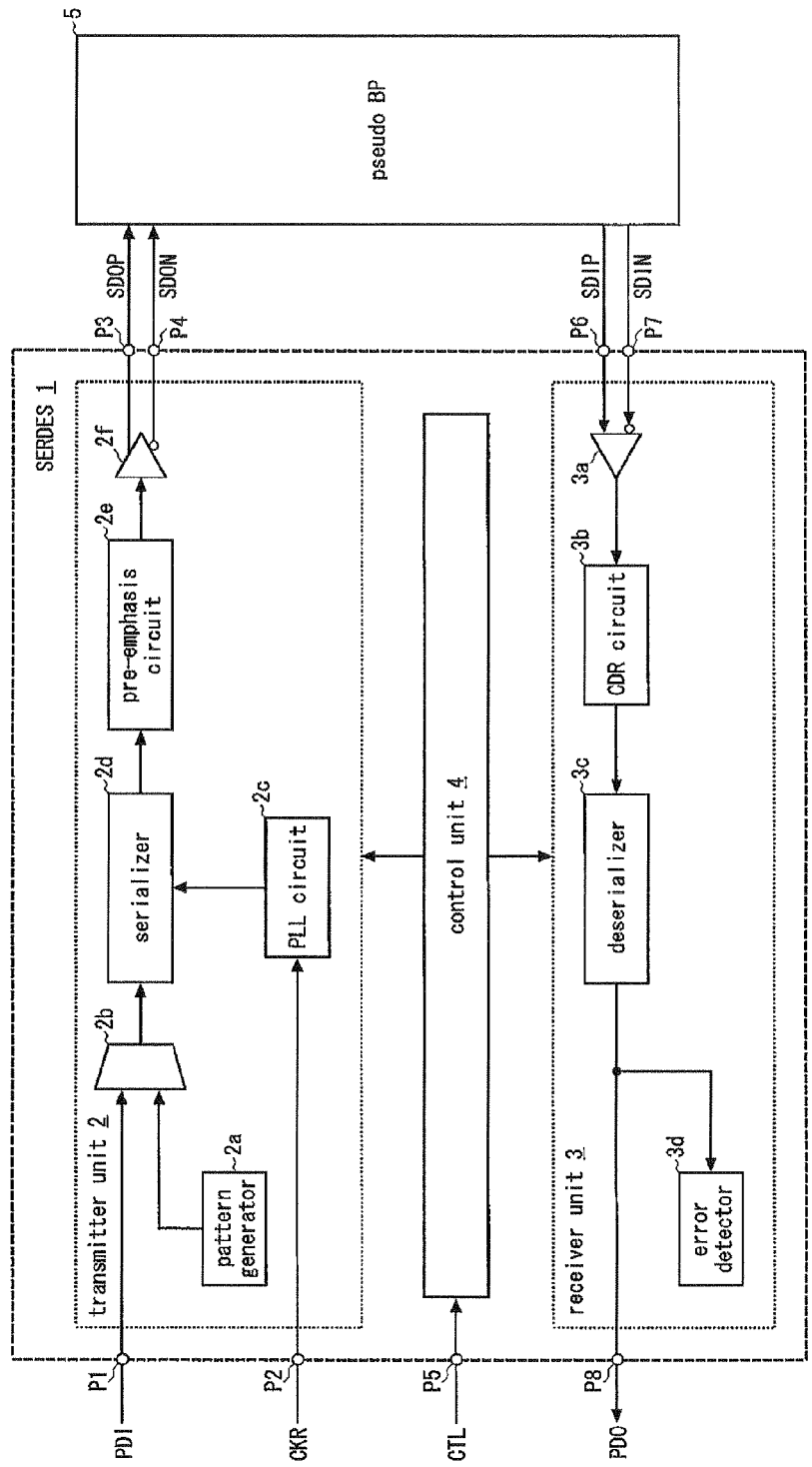
FIG. 6 is an explanatory view showing a back plane transmission margin test of a SERDES of a prior art.
Figure 7:
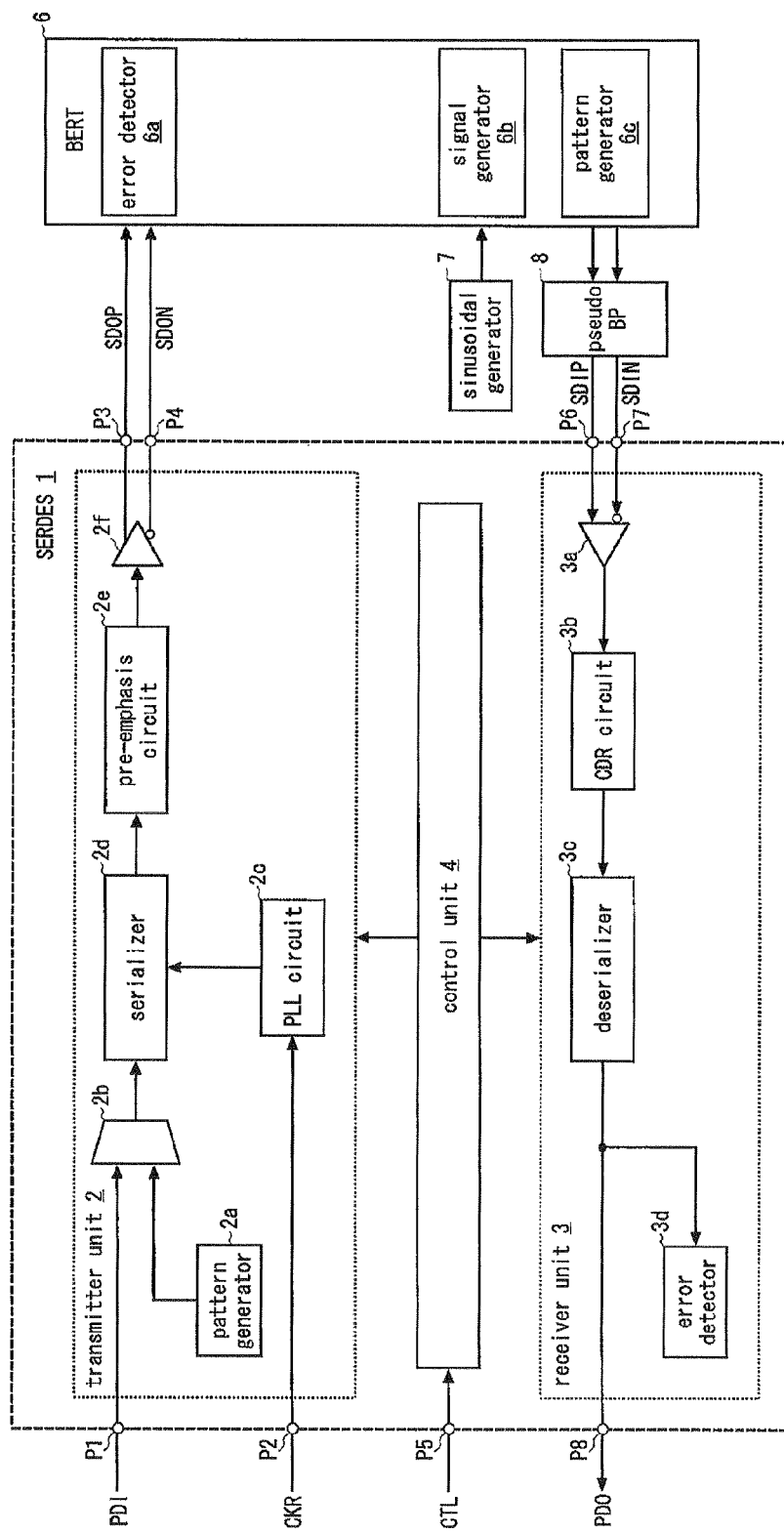
FIG. 7 is an explanatory view showing a jitter tolerance test of a SERDES of a prior art.

The fourteenth embodiment (sixteenth~twenty-second embodiments) has described the example where the transmitter unit 2N that is the same as the transmitter unit 2 (FIG. 6)

and the receiver unit 3N (3O~3U) are combined to constitute the SERDES, but the present invention is not limited to such an embodiment. For example, one of the transmitter units 2A~2M (first~thirteenth embodiments) and the receiver unit 3N (3O~3U) may be combined to constitute the SERDES, and further, this SERDES, similarly to the SERDES 1W (twenty-fourth embodiment), may include the path for supplying the output signal of the equalizing circuit 3e as the input signal of the driver 2f.

Further, the first~thirteenth, twenty-third, and twenty-fourth embodiments have described the examples where the waveform deteriorating process is executed in the transmitter unit by utilizing the pre-emphasis function, but the present invention is not limited to such embodiments. Needless to say, any other method enabling the execution of the waveform deteriorating process in the transmitter unit may be employed. Similarly, the fourteenth~twenty-fourth embodiments have described the examples where the waveform deteriorating process is executed in the receiver unit by utilizing the equalizing function, but the present invention is not limited to such embodiments. Needless to say, any other method enabling the execution of the waveform deteriorating process in the receiver unit may be employed.

In addition, the ordinal numbers of the embodiments have nothing to do with the importance of the invention.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A transmitter/receiver device having a transmitter unit and a receiver unit, wherein:
    said transmitter unit comprises:
    a parallel/serial converting circuit converting a transmitter-side parallel signal to a transmitter-side serial signal;
    a pre-emphasis circuit deteriorating a signal waveform of said transmitter-side serial signal by an amplitude attenuation function which attenuates a signal amplitude of said transmitter-side serial signal by utilizing a pre-emphasis function which emphasizes a high-frequency component of said transmitter-side serial signal; and
    a transmitter circuit transmitting to said receiver unit the signal which waveform is deteriorated by the amplitude attenuation function of said pre-emphasis circuit; and
    said receiving unit comprises:
    a receiver circuit receiving, as a receiver-side serial signal, the signal transmitted from said transmitter circuit;
    a serial/parallel converting circuit converting said receiver-side serial signal to a receiver-side parallel signal; and
    an error detecting circuit detecting a bit error rate of said receiver-side parallel signal.

2. The transmitter/receiver device according to claim 1, further comprising
    a variable filter which filters said transmitter-side serial signal based on a frequency characteristic, the frequency characteristic being set according to a loss characteristic of a transmission medium.

3. The transmitter/receiver device according to claim 1, further comprising
    a duty cycle distortion generating circuit which generates duty cycle distortion in said transmitter-side serial signal.

4. The transmitter/receiver device according to claim 1, further comprising:
    a clock generating circuit which generates, based on a reference clock, a clock used in a conversion operation of said parallel/serial converting circuit; and
    a sinusoidal jitter generating circuit which generates sinusoidal jitter in said reference clock.

5. The transmitter/receiver device according to claim 1, further comprising:
    a clock generating circuit which generates, based on a reference clock, a clock used in a conversion operation of said parallel/serial converting circuit; and
    a white noise generating circuit which generates white noise in said reference clock.

6. The transmitter/receiver device according to claim 1, further comprising:
    a clock generating circuit which generates, based on a reference clock, a clock used in a conversion operation of said parallel/serial converting circuit; and
    a jitter generating circuit which selects one of sinusoidal jitter or white noise and generates the selected one in said reference clock.

7. The transmitter/receiver device according to claim 1, further comprising:
    an equalizing circuit which deteriorates a signal waveform of said receiver-side serial signal by an amplitude attenuation function which attenuates a signal amplitude of said receiver-side serial signal by utilizing an equalizing function which emphasizes a high-frequency component of said receiver-side serial signal, wherein
    said serial/parallel converting circuit converts the signal whose waveform is deteriorated by the amplitude attenuation function of said equalizing circuit to said receiver-side parallel signal.

8. The transmitter/receiver device according to claim 7, further comprising:
    a signal path which is set for supplying the signal whose waveform is deteriorated by the amplitude attenuation function of said equalizing circuit to said transmitter circuit and which becomes effective when receiving a signal transmitted from an external part as said receiver-side serial signal, wherein
    said transmitter circuit transmits the signal whose waveform is deteriorated by the amplitude attenuation function of said equalizing circuit to an external part when said signal path becomes effective.

9. A transmitter/receiver device having a transmitter unit and a receiver unit, wherein:
    said transmitter unit comprises:
    a parallel/serial converting circuit converting a transmitter-side parallel signal to a transmitter-side serial signal; and
    a transmitter circuit transmitting said transmitter-side serial signal to said receiving unit; and
    said receiver unit comprises:
    a receiver circuit receiving, as a receiver-side serial signal, the signal transmitted from said transmitter circuit;
    an equalizing circuit deteriorating a signal waveform of said receiver-side serial signal by an amplitude attenuation function which attenuates a signal amplitude of said receiver-side serial signal by utilizing an equalizing function which emphasizes a high-frequency component of said receiver-side serial signal;

a serial/parallel converting circuit converting the signal whose waveform is deteriorated by the amplitude attenuation function of said equalizing circuit to a receiver-side parallel signal; and an error detecting circuit detecting a bit error rate of said receiver-side parallel signal.

10. The transmitter/receiver device according to claim 9, further comprising a duty cycle distortion generating circuit which generates duty cycle distortion in said receiver-side serial signal.

11. The transmitter/receiver device according to claim 9, further comprising a sinusoidal jitter generating circuit which generates sinusoidal jitter in said receiver-side serial signal.

12. The transmitter/receiver device according to claim 9, further comprising a white noise generating circuit which generates white noise in said receiver-side serial signal.

13. The transmitter/receiver device according to claim 9, further comprising a jitter generating circuit which selects one of sinusoidal jitter and white noise and generates the selected one in said receiver-side serial signal.

14. A method of testing a transmitter/receiver device having a transmitter unit and a receiver unit, the method comprising:

executing in said transmitter unit:

converting a transmitter-side parallel signal to a transmitter-side serial signal;

deteriorating a signal waveform of said transmitter-side serial signal by an amplitude attenuation function which attenuates a signal amplitude of said transmitter-side serial signal by utilizing a pre-emphasis function which emphasizes a high-frequency component of said transmitter-side serial signal; and transmitting the signal whose waveform is deteriorated by the amplitude attenuation function, and executing in said receiver unit:

receiving, as a receiver-side serial signal, said signal whose waveform is deteriorated;

converting said receiver-side serial signal to a receiver-side parallel signal; and detecting a bit error rate of said receiver-side parallel signal to measure a signal transmission margin.

15. The method of testing the transmitter/receiver device according to claim 14, further comprising filtering said transmitter-side serial signal based on a frequency characteristic set according to a loss characteristic of a transmission medium.

16. The method of testing the transmitter/receiver device according to claim 14, further comprising generating duty cycle distortion in said transmitter-side serial signal.

17. The method of testing the transmitter/receiver device according to claim 14, further comprising:

generating, based on a reference clock, a clock used in converting said transmitter-side parallel signal to said transmitter-side serial signal; and generating sinusoidal jitter in said reference clock.

18. The method of testing the transmitter/receiver device according to claim 14, further comprising:

generating, based on a reference clock, a clock used in converting said transmitter-side parallel signal to said transmitter-side serial signal; and generating white noise in said reference clock.

19. The method of testing the transmitter/receiver device according to claim 14, further comprising:

generating, based on a reference clock, a clock used in converting said transmitter-side parallel signal to said transmitter-side serial signal; and selecting one of sinusoidal jitter and white noise and generating the selected one in said reference clock.

20. The method of testing the transmitter/receiver device according to claim 14, wherein deteriorating the signal waveform of said transmitter-side serial signal, an eye opening width of said transmitter-side serial signal is adjusted to an eye opening width prescribed in a predetermined standard.

* * * * *